United States Patent
Kawawake et al.

(10) Patent No.: US 6,535,362 B2
(45) Date of Patent: *Mar. 18, 2003

(54) MAGNETORESISTIVE DEVICE HAVING A HIGHLY SMOOTH METAL REFLECTIVE LAYER

(75) Inventors: Yasuhiro Kawawake, Uji (JP); Hiroshi Sakakima, Kyotanabe (JP); Mitsuo Satomi, Katano (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/979,886

(22) Filed: Nov. 26, 1997

(65) Prior Publication Data

US 2001/0046110 A1 Nov. 29, 2001

(51) Int. Cl.$^7$ .............................................. G11B 5/127
(52) U.S. Cl. ................................................... 360/324.1
(58) Field of Search ............................. 360/113, 324.1; 338/32 R; 324/252

(56) References Cited

U.S. PATENT DOCUMENTS

| | | | | |
|---|---|---|---|---|
| 5,287,238 A | * | 2/1994 | Baumgart et al. | 360/113 |
| 5,301,079 A | * | 4/1994 | Cain et al. | 360/113 |
| 5,329,413 A | * | 7/1994 | Kondoh et al. | 360/113 |
| 5,422,571 A | | 6/1995 | Gurney et al. | 324/252 |

FOREIGN PATENT DOCUMENTS

| | | |
|---|---|---|
| EP | 0677750 | 1/1995 |
| JP | 05234754 | 9/1993 |
| JP | 06236527 | 8/1994 |
| JP | 06325934 | 11/1994 |
| JP | 07262529 | 10/1995 |
| JP | 07288347 | 10/1995 |
| JP | 07297465 | 10/1995 |
| JP | 08051022 | 2/1996 |
| JP | 08138935 | 5/1996 |

OTHER PUBLICATIONS

M. Horn–von Hoegen et al.; Epitaxial Layer Growth of Ag(111)—Films on Si(100); Surface Science 331–333 (1995); pp. 575–579.

J.A. Meyer et al.; Preferential Island Nucleation at the Elbows of the Au(111) Herringbone Reconstruction Through Place Exchange; Surface Science 365 (1996); pp. L647–L651.

S. Chiang et al.; Structure of Au on Ag(110) Studied by Scanning Tunneling Microscopy; Journal of Vacuum Science Technology B, vol. 12, No. 3, May/Jun. (1994); pp. 1747–1750.

B.A. Gurney et al., Physical Review Letters, vol. 71, No. 24, pp. 4023–4026, 1993, "Direct Measurement of Spin–Dependent Conduction–Election Mean Free Paths in Ferromagnetic Metals".

H.J.M. Swagten et al., Physical Review B, vol. 53, No. 14, pp. 9108–9114, 1996, "Enhanced Giant Magnetoresistance in Spin–Valves Sandwiched Between Insulating NiO".

Japanese Office Action dated Apr. 24, 2000 for Japanese Patent Application No. 9–326822—Translation Included.

* cited by examiner

*Primary Examiner*—David Davis
(74) *Attorney, Agent, or Firm*—Renner, Otto, Boisselle & Sklar, LLP

(57) ABSTRACT

The magnetoresistive device of the present invention includes: at least two magnetic layers stacked via a non-magnetic layer therebetween; and a metal reflective layer of conduction electrons formed so as to be in contact with at least one of outermost two layers of the magnetic layers. The metal reflective layer is in contact with one surface of the outermost magnetic layer which is opposite to the other surface of the outermost magnetic layer in contact with the non-magnetic layer. The metal reflective layer is likely to reflect conduction electrons while maintaining a spin direction of electrons.

41 Claims, 5 Drawing Sheets

MAGNETORESISTIVE DEVICE HAVING A HIGHLY SMOOTH METAL REFLECTIVE LAYER

BACKGROUND OF THE INVENTION

1. Field of the Invention

The present invention generally relates to a magnetoresistive device and a magnetoresistive head. More particularly, the present invention relates to a magnetoresistive device in which a magnetoresistance is greatly changed in a low magnetic fields, and to a magnetoresistive head which is configured using such a magnetoresistive device and is suitable for high-density magnetic recording and reproducing operations.

2. Description of the Related Art

A magnetoresistive sensor (hereinafter, simply referred to as an "MR sensor") and a magnetoresistive head (hereinafter, simply referred to as an "MR head") using a magnetoresistive device have been under development. Conventionally, a permalloy made of $Ni_{0.8}Fe_{0.2}$ and an alloy film made of $Ni_{0.8}Co_{0.2}$ are mainly used as magnetic materials for these devices. The ratio of change in magnetoresistance (hereinafter, simply referred to as an "MR ratio") of these magnetoresistive materials is about 2.5%. In order to develop a magnetoresistive device exhibiting a higher sensitivity, a magnetoresistive material having a higher MR ratio is required.

It was recently found that [Fe/Cr] and [Co/Ru] multilayers in which an antiferromagnetic coupling is attained via a metal non-magnetic thin film made of Cr or Ru exhibit a giant magnetoresistance effect in a ferromagnetic field (about 1 to about 10 kilo-oersteds (kOes)) (Physical Review Letter Vol. 61, p. 2472, 1988; and Physical Review Letter Vol. 64, p. 2304, 1990).

However, since these artificial multilayers require a magnetic field having an intensity of several to several tens of kOes in order to obtain a large MR change, such artificial multilayers cannot be practically applied to a magnetic head and the like.

In addition, it was also found that an [Ni—Fe/Cu/Co] artificial multilayer using magnetic thin films made of Ni—Fe and Co having different coercivities in which they are separated by a metal non-magnetic thin film made of Cu and which are not magnetically coupled to each other exhibits a giant magnetoresistance effect, and a magnetoresistive material which has an MR ratio of about 8% when a magnetic field an intensity of about 0.5 kOe is applied at room temperature was obtained (Journal of Physical Society of Japan, Vol. 59, p. 3061, 1990).

However, in the case of using a magnetoresistive material of such a type, a magnetic field having an intensity of about 100 Oes is required for obtaining a large MR change. Moreover, the magnetoresistance thereof asymmetrically varies from the negative magnetic field to the positive magnetic field. i.e. the magnetoresistance thereof exhibits a poor linearity. Thus, such a magnetoresistive material has characteristics which are not suitable for practical use.

Moreover, it was also found that [Ni—Fe—Co/Cu/Co] and [Ni—Fe—Co/Cu] artificial multilayers using magnetic thin films made of Ni—Fe—Co and Co in which an RKKY-type antiferromagnetic coupling is attained via Cu exhibit a giant magnetoresistance effect, and a magnetoresistive material which has an MR ratio of about 15% when a magnetic field having an intensity of about 0.5 kOe is applied at room temperature was obtained (Technical Report by THE INSTITUTE OF ELECTRONICS, INFORMATION AND COMMUNICATION ENGINEERS of Japan, MR91-9).

However, in the case of using a magnetoresistive material of such a type, the magnetoresistance thereof varies substantially linearly from the zero magnetic field to the positive magnetic field and the material has properties which are sufficiently suitable for the application to an MR sensor. Nevertheless, in order to obtain a large MR change, a magnetic field having an intensity of about 50 Oes is also required. Thus, such a property is not appropriate for the application to an MR head which is required to be operated at most at about 20 Oes and preferably less.

As a film which can he operated even when a very weak magnetic field is applied, a spin-valve type film in which Fe—Mn as an antiferromagnetic material is attached to a structure of Ni—Fe/Cu/Ni—Fe has been proposed (Journal of Magnetism and Magnetic Materials 93, p. 101, 1991). The operating magnetic field of a magnetoresistive material of this type is actually weak, and a good linearity is observed. However, the MR ratio thereof is as small as about 2%, and the Fe—Mn film has poor corrosion resistance and a low Neel temperature (ordering temperature). Consequently, the properties of such a device disadvantageously exhibit a great temperature dependence.

Furthermore, a spin-valve film having a structure of Ni—Fe/Cu/Co—Pt or the like using a hard magnetic material such as Co—Pt instead of an antiferromagnetic material has also been proposed. In such a case, a parallel magnetization state and an anti-parallel magnetization state are created by rotating the magnetization direction of a soft magnetic layer at a coercivity equal to or less than that of a hard magnetic layer. However, even when such a structure is employed, it is still difficult to improve the properties of the soft magnetic layer. Thus, this structure has not been used practically, either.

Moreover, a structure such as Cu/Ni—Fe/Cu/Ni—Fe/Fe—Mn formed by attaching a low-resistance back layer, made of a metal having a low resistance, to the back of a spin-valve film has also been proposed as a means for increasing the MR ratio of a spin valve film (U.S. Pat. No. 5,422,571). Such a structure is an attempt to increase the MR ratio by lengthening the mean free path of the electrons having a particular spin direction.

A conventional spin-valve type MR device, no matter whether the device is of the type using an antiferromagnetic material or of the type using a hard magnetic layer, had a problem in that the MR ratio thereof is low, even though the magnetic field sensitivity thereof is excellent. Similarly, the MR ratio cannot be satisfactorily increased even when the low-resistance back layer is provided. This is presumably because a small thickness of a spin-valve type MR device is likely to cause the diffusive scattering of electrons on the surface of the device.

Such a phenomenon can be explained in more detail as follows.

A giant magnetoresistance effect originally results from the spin-dependent scattering of electrons at an interface between a magnetic layer and a non-magnetic layer. Thus, in order to increase the possibility of the scattering generation, it is important to lower the possibility of the non-spin-dependent scattering generation and to lengthen the mean free path of electrons. In a spin-valve film, the number of magnetic layers and non-magnetic layers to be stacked is small. Thus, the film thickness of a spin-valve film is generally smaller (e.g., in the range from about 20 nm to about 50 nm) than that of an antiferromagnetic coupling type giant magnetoresistive film. Consequently, the possibility that electrons are scattered on the surface of such a film is high, and the mean free path of electrons is short. This is the principal reason why the MR ratio of a spin-valve film becomes low.

Ordinarily, the surface of a thin film has some unevenness on the order of several tenths of a nm which is substantially on the same order of the wavelength of conduction electrons (i.e., a Fermi wavelength). In such a case, the conduction electrons are subjected to diffusive scattering on the surface of the film. In general, in the case of a diffusive scattering, the spin direction of electrons is not maintained.

SUMMARY OF THE INVENTION

The magnetoresistive device of the present invention includes: at least two magnetic layers stacked via a non-magnetic layer therebetween; and a metal reflective layer of conduction electrons formed so as to be in contact with at least one of outermost two layers of the magnetic layers. the metal reflective layer being in contact with one surface of the outermost magnetic layer which is opposite to the other surface of the outermost magnetic layer in contact with the non-magnetic layer, the metal reflective layer being likely to reflect conduction electrons while maintaining a spin direction of electrons.

In one embodiment, the magnetoresistive device further includes a non-magnetic layer between the metal reflective layer and the magnetic layer.

In another embodiment, the non-magnetic layers are mainly composed of Cu, and the metal reflective layer is mainly composed of at least one of Ag, Au, Bi, Sn and Pb.

In still another embodiment, the magnetic layer in contact with the metal reflective layer via the non-magnetic layer is mainly composed of a Co-rich Co—Fe alloy.

In still another embodiment, the magnetic layer includes at least two layers of a magnetic layer and an or a Co-rich Co—Fe alloy, the interface magnetic layer being in contact with the metal reflective layer via the non-magnetic layer.

In still another embodiment, the magnetic layer in contact with the metal reflective layer via the non magnetic layer includes at least two interface magnetic layers which sandwich a soft magnetic layer therebetween and are mainly composed of Co or a Co-rich Co—Fe alloy.

In still another embodiment, the metal reflective layer has a smooth surface.

In still another embodiment, at least a part of the surface of the metal reflective layer is smooth on the order of tenths of a nm.

In still another embodiment, at least 10% of the surface of the metal reflective layer is a smooth surface having an unevenness of about three angstrom or less.

In still another embodiment, the magnetic layer directly in contact with the metal reflective layer is mainly composed of Co or a Co-rich Co—Fe alloy.

In still another embodiment, the magnetic layer includes at least two layers of a magnetic layer and an interface magnetic layer which is mainly composed of Co or a Co-rich Co—Fe alloy, the interface magnetic layer being directly in contact with the metal reflective layer.

In still another embodiment, the magnetic layer directly in contact with the metal reflective layer includes at least two interface magnetic layers which sandwich a soft magnetic layer therebetween and are mainly composed of Co or a Co-rich Co—Fe alloy.

In still another embodiment, at least one of the at least two magnetic layers has a different coercivity from a coercivity of the other magnetic layer(s).

In still another embodiment. the magnetoresistive device includes: a first and a second magnetic layer which are stacked via a non-magnetic layer; an antiferromagnetic layer formed in contact with a surface of the first magnetic layer which is opposite to the other surface of the first magnetic layer in contact with the non-magnetic layer; and a metal reflective layer formed in contact with a surface of the second magnetic layer which is opposite to the other surface of the second magnetic layer in contact with the non-magnetic layer.

In still another embodiment, the antiferromagnetic layer is an oxide.

In still another embodiment, the antiferromagnetic layer is made of Ni—O.

In still another embodiment, the antiferromagnetic layer is made of $\alpha$-$Fe_2O_3$.

In still another embodiment, the second magnetic layer includes two or more magnetic layers which are stacked via a non-magnetic layer.

In still another embodiment, the antiferromagnetic layer is epitaxially grown over a substrate.

In still another embodiment, the magnetoresistive device includes a structure in which a first magnetic layer, the non magnetic layer, a second magnetic layer, an antiferromagnetic layer and the metal reflective layer are stacked in this order.

In still another embodiment, the magnetoresistive device further includes a non-magnetic layer between the antiferromagnetic layer and the metal reflective layer.

In still another embodiment, the antiferromagnetic layer is made of an Ir—Mn alloy.

In still another embodiment, the magnetoresistive device includes a structure in which a first antiferromagnetic layer, a magnetic layer, a non-magnetic layer, a soft magnetic layer, a non-magnetic layer, a magnetic layer, a second antiferromagnetic layer and a metal reflective layer are stacked in this order directly on a substrate or over the substrate via an underlying layer.

In still another embodiment, the magnetoresistive device further includes a non-magnetic layer between the second antiferromagnetic layer and the metal reflective layer.

In still another embodiment, the second antiferromagnetic layer is made of an Ir—Mn alloy.

In still another embodiment, the first antiferromagnetic layer is an oxide.

In still another embodiment, the first antiferromagnetic layer is made of Ni—O.

In still another embodiment, the soft magnetic layer includes two or more magnetic layers which are stacked via a non-magnetic layer.

In still another embodiment, at least one of the first and the second antiferromagnetic layers are made of an Ir—Mn alloy.

In still another embodiment, the first antiferromagnetic layer is made of $\alpha$-$Fe_2O_3$.

In still another embodiment, the first antiferromagnetic layer is epitaxially grown over the substrate.

In still another embodiment, the magnetoresistive device includes a structure in which a metal reflective layer, a first antiferromagnetic layer, a magnetic layer, a non-magnetic layer, a soft magnetic layer, a non-magnetic layer, a magnetic layer, a second antiferromagnetic layer and a metal reflective layer are stacked in this order directly on a substrate or over the substrate via an underlying layer.

In still another embodiment, the magnetoresistive device further includes a non-magnetic layer between the first antiferromagnetic layer and the metal reflective layer and/or between the second antiferromagnetic layer and the metal reflective layer.

In still another embodiment, the non-magnetic layer is epitaxially grown over the substrate.

In still another embodiment, a (100) plane of the non-magnetic layer is epitaxially grown vertically to a growth direction of thin layers.

In still another embodiment, the non-magnetic layer is epitaxially grown over an Mgo (100) substrate via a Pt underlying layer.

The magnetoresistive head of the present invention includes: a magnetoresistive device including at least two magnetic layers which are stacked via a non magnetic layer therebetween, and a metal reflective layer of conduction electrons formed so as to be in contact with at least one of outermost two layers of the magnetic layers, the metal reflective layer being in contact with a surface of the outermost magnetic layer which is opposite to the other surface of the outermost magnetic layer in contact with the non-magnetic layer, the metal reflective layer being likely to reflect conduction electrons while maintaining a spin direction of electrons; and a lead portion for supplying current to the magnetoresistive device. A magnetization easy axis of a magnetic layer having a smallest coercivity of the magnetoresistive device or a magnetization easy axis of a magnetic layer not in contact with an antiferromagnetic layer is vertical to a direction of a signal magnetic field to be detected.

Hereinafter, the functions or the effects to be attained by the present invention will be described.

The magnetoresistive device of the present invention is characterized by including a metal reflective layer, which is likely to cause a specular scattering while maintaining the spin direction of electrons, on the surface of a spin-valve film.

The metal reflective layer is required to have a surface which can be regarded as smooth on the order of several tenths of a nm. In such a case, conduction electrons generate an elastic scattering (specular scattering) at the surface of a film, the spin direction of the conduction electrons is reserved, and the same effects as those attained when the mean free path thereof has become longer can be attained. As a result, the MR ratio is increased.

The metal reflective layer is preferably made of a material such as Ag, Au, Bi, Sn or Pb. These materials are likely to contribute to a smooth surface on the order of several tenths of a nm, unlike the materials such as Ni, Fe, Cu and Co which are frequently used for a spin-valve film. Among these materials, Ag and Au are more preferable, and Ag is most effective. In the case of using Ag or Au, the (111) plane is more likely to be smooth and it is easier to obtain a surface which can be regarded as smooth on the order of several tenths of a nm. Thus, the (111) plane is preferably substantially parallel to the surface of a substrate.

More preferably, a non-magnetic layer made of Cu or the like is inserted between the metal reflective layer and (a magnetic layer of) the spin-valve film. The non magnetic layer not only functions as a buffer layer for smoothing the surface of the metal reflective layer, but also increases the spin-dependent scattering at the interface between the non-magnetic layer and the magnetic layer.

Moreover, it is also preferable to provide a Co layer between the magnetic layer and the metal reflective layer. The layer is provided for increasing the MR ratio by enhancing the spin-dependent scattering in the interface between the magnetic layer and the non-magnetic layer (i.e., the metal reflective layer).

More preferably, the entire spin-valve film is epitaxially grown over a single crystalline substrate.

Furthermore, the magnetoresistive device of the present invention is preferably configured such that the magnetization-easy axis of a soft magnetic layer in a magnetoresistive device portion is vertical to the direction of a signal magnetic field to be detected.

The magnetoresistive head of the present invention is characterized by further including a lead portion, in addition to the magnetoresistive device.

Thus, the invention described herein makes possible the advantages of (1) providing a magneto resistive device having a high MR ratio and a magnetoresistive head using the same, (2) providing a spin-valve type magnetoresistive device in which electrons have a long mean free path and a magnetoresistive head using the same, and (3) providing a spin-valve type magnetoresistive device, In which the possibility of the spin-dependent scattering generation of electrons is high at an interface between a magnetic layer and a non-magnetic layer and a magnetoresistive head using the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the magnetoresistive device and the magnetoresistive head of the present invention will be described with reference to the accompanying drawings.

FIG. 1A through FIG. 5 are cross-sectional views showing exemplary embodiments of the magnetoresistive device of the present invention. Among these figures, FIG. 1A through FIG. 3 show examples of spin-valve films using a hard magnetic layer (i.e., two types of magnetic layers having respectively different coercivities). In this case, a magnetic layer having the larger coercivity will be called a "hard magnetic layer" and a magnetic layer having the smaller coercivity will be called a "soft magnetic layer".

Figure 1A:
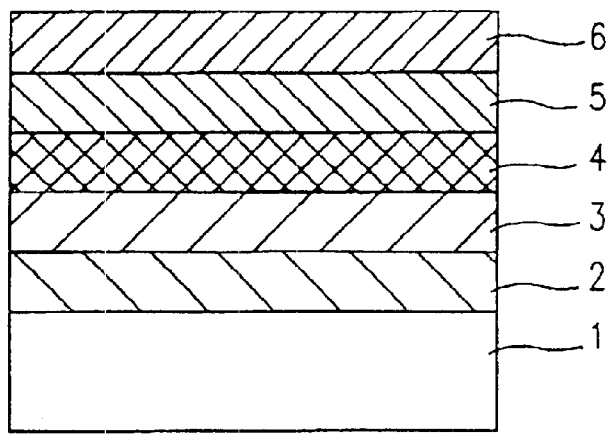
FIGS. 1A to 1C are cross-sectional views showing embodiments of the magnetoresistive device of the present invention.

A magnetoresistive device of the present invention shown in FIG. 1A has a structure in which a soft magnetic layer 3, a non-magnetic layer 4, a hard magnetic layer 5 and a metal reflective layer 6 are stacked in this order over a substrate 1 via an underlying layer 2. In a conventional spin-valve device, the metal reflective layer 6 is not provided and a protective layer is formed instead on the surface thereof. In the case of forming an MR head, an insulating film or the like is used as a shield gap material.

An Ni—Co—Fe alloy is generally suitable as a material for the soft magnetic layer 3 of the spin-valve film. Preferably, the Ni—Co—Fe film is an Ni-rich soft magnetic layer represented as $Ni_xCo_yFe_z$ having an atomic composition ratio satisfying the following ranges:

$0.6 \leq x \leq 0.9$
$0 \leq y \leq 0.4$
$0 \leq z \leq 0.3$ or a Co-rich soft magnetic layer represented as $Ni_{x'}Co_{y'}Fe_{z'}$ having an atomic composition ratio satisfying the following ranges:

$0 \leq x' \leq 0.4$
$0.2 \leq y' \leq 0.95$
$0 \leq z' \leq 0.5$

The films having these compositions exhibit low magnetostriction properties ($1 \times 10^{-5}$) required for an MR sensor or an MR head.

Alternatively, the soft magnetic layer 3 may also be an amorphous film made of Co—Mn—B, Co—Fe—B, Co—Nb—Zr, Co—Nb—B or the like.

The film thickness of the soft magnetic layer 3 is preferably in the range from about 1 nm to about 10 nm, both inclusive. The reason is as follows. If the film is too thick, the MR ratio is decreased owing to a shunt effect. On the other hand, if the film is too thin, the soft magnetic properties thereof are deteriorated. The thickness is more preferably in the range from about 2 nm to about 5 nm, both inclusive, most preferably in the range from about 2 nm to about 3 nm, both inclusive.

The hard magnetic layer 5 is preferably made of a ferromagnetic material having a square ratio of about 0.7 or more, more preferably about 0.85 or more. Herein, the "square ratio" can be represented as a ratio of a residual magnetic field Mr to a saturated magnetic field Ms (=Mr/Ms).

If the square ratio of the hard magnetic layer 5 is small, then a totally parallel magnetization state or a totally antiparallel magnetization state cannot be established between the hard magnetic layer 5 and the soft magnetic layer 3. Thus, a hard magnetic layer having a large square ratio is desirably used.

Co group materials including Co, Co—Fe alloys and Co—Pt alloys exhibit excellent properties as the materials for the hard magnetic layer 5. Co and Co—Fe alloys are particularly preferable.

The film thickness of the hard magnetic layer 5 is preferably in the range from about 1 nm to about 10 nm, both inclusive. The reason is as follows. If the film is too thick, the MR ratio is decreased owing to a shunt effect. On the other hand, if the film is too thin, the magnetic properties thereof are deteriorated. The thickness is more preferably in the range from about 1 nm to about 5 nm, both inclusive.

Cu, Ag, Au, Ru or the like may be used as a material for the non-magnetic layer 4 between the hard magnetic layer 5 and the soft magnetic layer 3. Among these materials, Cu is most suitably used. In order to weaken the interaction between the two magnetic layers 5 and 3, the film thickness of the nonmagnetic layer 4 is required to be at least about 1.5 nm or more, desirably about 1.8 nm or more. However, if the non-magnetic layer 4 becomes too thick, then the MR ratio thereof is adversely decreased. Thus, the film thickness of the non-magnetic layer 4 should be about 10 nm or less, desirably about 3 nm or less.

In addition, it is also effective to insert another non-magnetic layer having a thickness of about 1 nm or less into the non-magnetic layer 4, in order to reduce the magnetic coupling between the hard magnetic layer 5 and the soft magnetic layer 3. For example, instead of forming a single-layer non-magnetic layer 4 made of Cu, the non-magnetic layer may have a multi-layer structure such as Cu/Ag/Cu, Cu/Ag and Ag/Cu/Ag. The non-magnetic layer to be inserted is preferably made of Ag, Au or the like. In this case, the film thickness of the multi-layer non-magnetic layer 4 is desirably approximately equal to that of the single-layer non-magnetic layer 4. The film thickness of a non-magnetic layer to be inserted into the non-magnetic layer 4 is at most about 1 nm, desirably about 0.4 nm or less.

Moreover, it is also effective to insert an interface magnetic layer into the interface between a magnetic layer (i.e., the soft magnetic layer 3 or the hard magnetic layer 5) and the non-magnetic layer 4, in order to further increase the MR ratio. However, if the interface magnetic layer is too thick, then the magnetic field sensitivity of the MR ratio is deteriorated. Thus, the film thickness of the interface magnetic layer is preferably set at about 2 nm or less, desirably about 1.8 nm or less. On the other hand, in order to make the interface magnetic layer function effectively, the film thickness thereof is required to be at least about 0.2 nm, desirably about 0.8 nm or more. Co or a Co-rich Co—Fe alloy is desirably used as a material for the interface magnetic layer.

In the case where a polycrystalline film is fabricated, a material having a relatively smooth surface such as glass, Si or $Al_2O_3$-TiC is used for the substrate 1, unless an epitaxial film is formed as will be described later. In the case of fabricating an MR head, an $Al_2O_3$-TiC substrate is used.

The underlying layer 2 is provided for improving the crystallinity of the overlying MR device portion (ranging from the soft magnetic layer 3 to the metal reflective layer 6) and for increasing the MR ratio thereof, and is frequently made of Ta. In the case of fabricating an MR head, the underlying layer 2 made of Ta is not formed until an insulating layer made of $SiO_2$, $Al_2O_3$ or the like and a lower shield layer made of Ni—Fe or the like are formed on the substrate 1.

According to the present invention, the metal reflective layer 6 is further formed in addition to the above-described basic structure of the spin-valve film including the soft magnetic layer 3, the non-magnetic layer 4 and the hard magnetic layer 5, in order to further increase the MR ratio.

But for the metal reflective layer 6, conduction electrons would be diffusively scattered at the surface of the hard magnetic layer 5 so that the information about the spin polarization would be lost. A giant magneto-resistance effect results from the spin-dependent scattering of the conduction electrons. Thus, if the spin information is lost or reduced at the surface, then the MR ratio is decreased. This is why a large MR ratio cannot be obtained in a conventional spin-valve film.

In contrast, in the magnetoresistive device of the present invention including the metal reflective layer 6, a lot of conduction electrons are specularly scattered at the surface of the metal reflective layer 6. Consequently, a larger amount of spin information is reserved. What the electrons are specularly scattered at the surface of a thin film in this way, the same effects as those attained in the case of stacking multiple pairs of magnetic layers and non-magnetic layers can be attained. As a result, the MR ratio is increased.

In order to generate a specular scattering, the surface of a thin film needs to be regarded as a smooth interface (surface) when the unevenness of the surface is evaluated with reference to the wavelength of electrons (i.e., on the order of several angstrom). Herein, the "smooth surface" is ideally a totally smooth surface having no unevenness. However, even when a surface has a large unevenness on the order of several nm, the surface is still regarded as "smooth" so long as at least a part of the surface can be regarded as smooth on the order of $10^{-1}$ nm. Specifically, in the "smooth surface", a super-smooth surface region having an unevenness of about 0.3 nm or less and having an area of about 10 nm×10 nm is required to occupy at least about 10%, desirably about 20% of the entire surface. For such a purpose, a particular material is required to be selected.

Ag, Au, Bi, Sn, Pb or the like is preferred as a material for the metal reflective layer. These materials are likely to create a surface which can be regarded as smooth on the order of several tenth of a nm, unlike the materials such as Ni, Fe, Cu and Co which are frequently used in a spin-valve film. Among these materials, Ag and Au are superior and Ag is most effective. In the case of using Ag or Au, in particular, the (111) plane is more likely to be smooth and a surface which can be regarded as smooth on the order of several tenth of a nm can be easily obtained. Thus, it is desirable for the (111) plane to be parallel to the surface of a thin film. If the metal reflective layer is too thick, then the MR ratio is decreased owing to a shunt effect. Thus, the thickness of the metal reflective layer is preferably about 10 nm or less, more preferably about 3 nm or less. However, if the metal reflective layer is too thin, then the effect thereof is weakened. Thus, the thickness of the metal reflective layer is required to be at least about 0.5 nm, desirably about 1 nm or more.

Figure 1B:
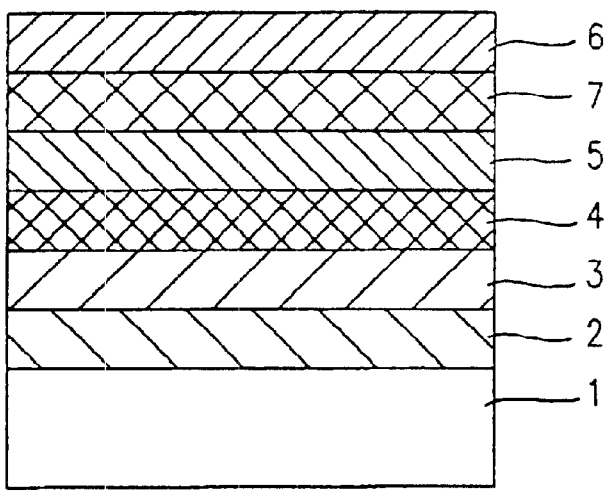

Moreover, if a non-magnetic layer 7 is inserted between the metal reflective layer 6 and the hard magnetic layer 5 as shown in FIG. 1B, then the MR ratio is further increased. When the magnetic layer 5 is made of a Co group material and the metal reflective layer 6 is made of a material such as Ag, Au or the like, it is particularly effective to insert a non magnetic layer 7 made of Cu or the like therebetween. The non magnetic layer 7 not only makes the surface of the metal reflective layer 6 smoother, but also increases the spin-dependent scattering. This is because the spin-dependent scattering to be generated at an interface between a magnetic layer and a non-magnetic layer is larger in a Co/Cu interface than in a Co/Ag interface. In view of this phenomenon, when the magnetic layer 5 is made of a material other than Co, a film showing a larger MR ratio can be obtained by inserting a layer made of Co or an interface magnetic layer made of Co or a Co—Fe alloy between the non-magnetic layer 7 and the magnetic layer 5. The preferable thickness of the interface magnetic layer is equal to that of the interface magnetic layer to be inserted between a magnetic layer (i.e., the soft magnetic layer 3 or the hard magnetic layer 5) and the non-magnetic layer 4.

The preferable material of the non-magnetic layer 7 is the same as that of the non-magnetic layer 4. The film thickness of the non-magnetic layer 7 is preferably about 2 nm or less, desirably about 1 nm or less. In order to increase the MR ratio, the thickness is required to be at least about 0.5 nm.

FIG. 1A shows a case where the soft magnetic layer 3, the non-magnetic layer 4, the hard magnetic layer 5 and the metal reflective layer 6 are formed in this order over the substrate 1 via the underlying layer 2. It is noted that the underlying layer 2 is optionally provided for increasing the MR ratio of the magnetoresistive device. Alternatively, the present invention is applicable to the case shown in FIG. 1C in which the four layers 3 to 6 are stacked in the inverse order to that of the cases shown in FIGS. 1A and 1B.

Figure 1C:
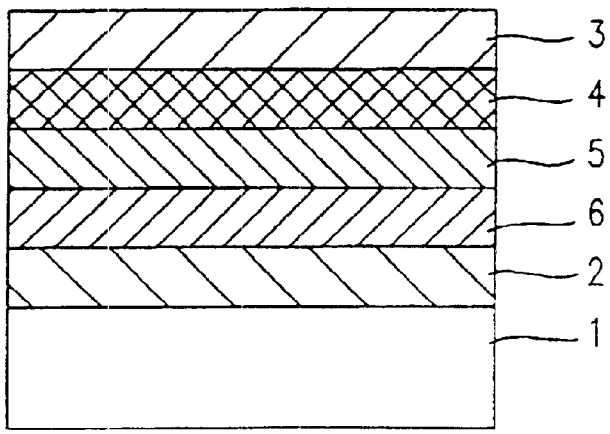
Figure 2A:
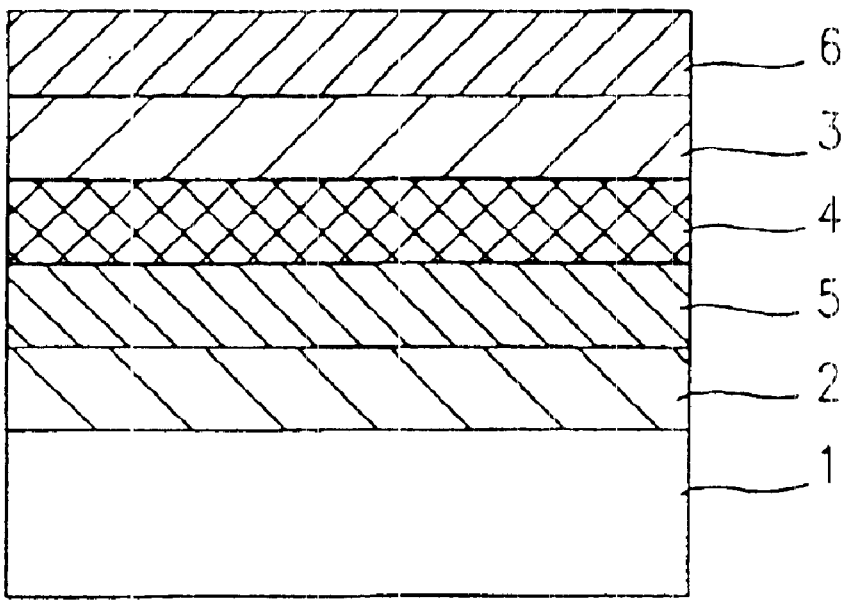
FIGS. 2A and 2B are cross-sectional views showing other embodiments of the magnetoresistive device of the present invention.
Figure 2B:
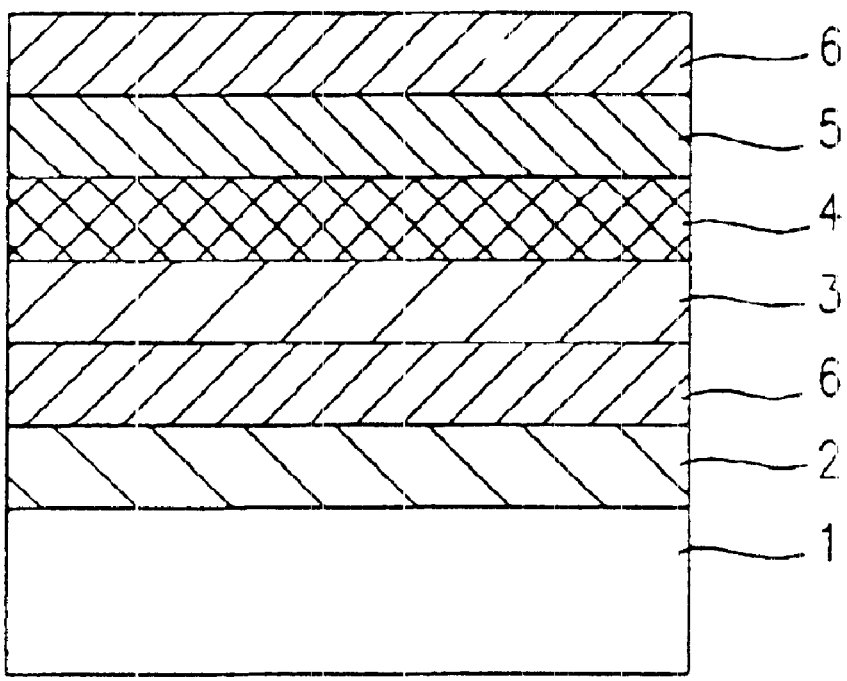

Moreover, instead of providing a single metal reflective layer 6 over either single type of magnetic layer (i.e., the soft magnetic layer 3 or the hard magnetic layer 5) as shown in FIGS. 1A to 1C and FIG. 2A, two metal reflective layers 6 may be provided over both types of magnetic layers as shown in FIG. 2B. In the latter case, the effect of the specular scattering of electrons and the effect of the increase in MR ratio are enhanced as compared with the case of providing a single metal reflective layer on either single type of magnetic layer.

Figure 3:
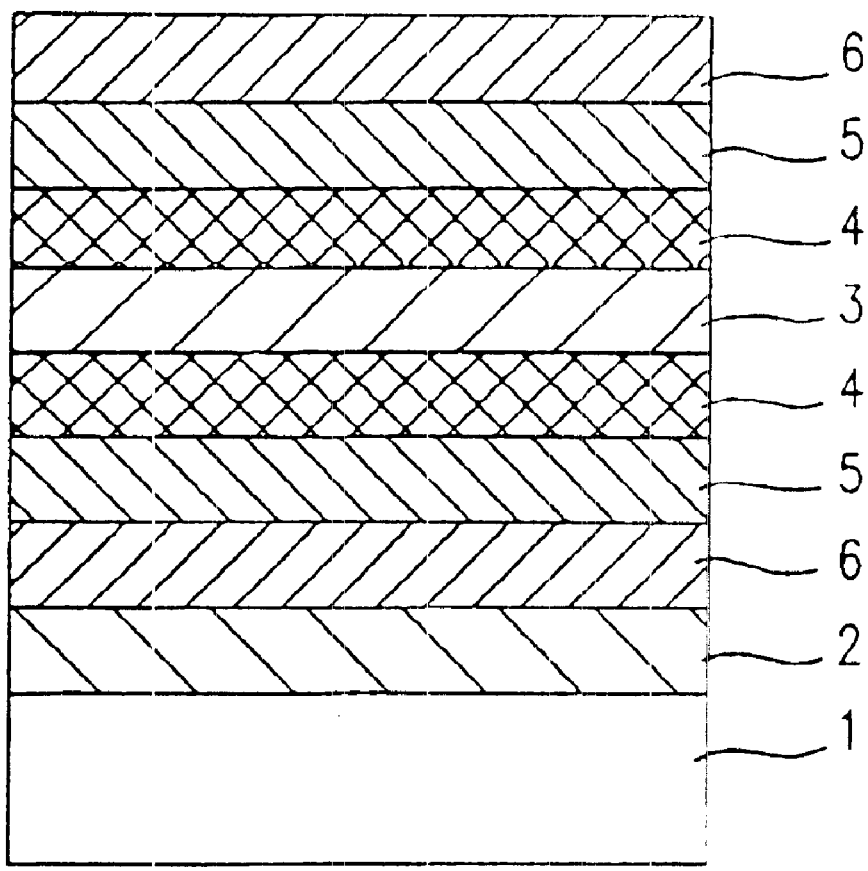
FIG. 3 is a cross-sectional view showing still another embodiment of the magnetoresistive device of the present invention.

FIG. 3 shows a case where the metal reflective layers 6 are provided on both surfaces of a dual spin-valve film. Since the number of magnetic layer/non-magnetic layer interfaces is increased in a so-called dual spin-valve film having a structure consisting of a hard magnetic layer 5, a non-magnetic layer 4, a soft magnetic layer 3, a non-magnetic layer 4 and a hard magnetic layer 5 as compared with a spin-valve film having a simple structure consisting of a hard magnetic layer 5, a non-magnetic layer 4 and a soft magnetic layer 3, the MR ratio thereof is also increased. The metal reflective layer 6 is also effectively applicable to such a dual spin-valve film. Moreover, in the case of providing a metal reflective layer on either one surface, effects can still be attained to a certain degree though the effects are less satisfactory.

The fact that the MR ratio is further increased by inserting a non-magnetic layer between the metal reflective layer 6 and a magnetic layer (i.e., the soft magnetic layer 3 or the hard magnetic layer 5) is true of all the cases shown in FIG. 1A through FIG. 5.

The above-described effects can be attained irrespective of whether the magneto-resistive device is a polycrystalline film or a single crystalline film. If the magnetoresistive device is an epitaxial film (or a single crystalline film), a particularly remarkable effect can be attained by providing the metal reflective layer 6. This is because the specular scattering on the surface is enhanced when the metal reflective layer 6 is an epitaxial layer.

Various methods may be employed for forming an epitaxial layer. In any case, a substrate made of MgO, Si or the like is preferably used. More preferably, an MgO (100) substrate or an Si (111) substrate is used.

In the case of using an MgO (100) substrate, a Pt layer is preferably formed as a first underlying layer and then a Cu layer is preferably formed as a second underlying layer. The film thickness of the Pt layer is preferably in the range from about 5 nm to about 50 nm, both inclusive. Thereafter, a device such as that shown in FIG. 1B is formed. In this case, if the non-magnetic layer 7 is made of Cu and the metal reflective layer 6 is made of Ag, the lattice constants of these layers are greatly different from each other. Consequently, a minor part of the Ag layer has the (100) orientation, but a major part thereof has the (111) orientation which is more likely to realize a lattice matching. The Ag layer has a highly smooth surface, in which the specular scattering is easily caused and which greatly increases the MR ratio advantageously.

In the case of using an Si (111) substrate, an Ag layer is directly formed on the substrate without providing any underlying layer, and then a non-magnetic layer made of Cu, a soft magnetic layer made of Ni—Fe, a non-magnetic layer made of Cu, a hard magnetic layer made of Co, a non-magnetic layer made of Cu and a metal reflective layer made of Ag are sequentially stacked thereon. In this case, the film thickness of the Ag layer on the substrate is required to be at least about 5 nm and at most about 10 nm.

Figure 4A:
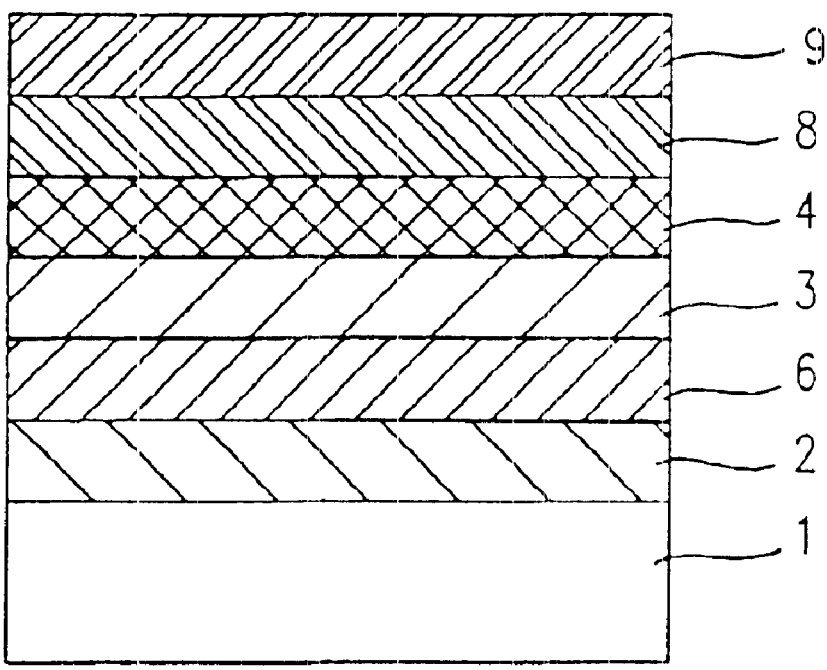
FIGS. 4A and 4B are cross-sectional views showing yet other embodiments of the magnetoresistive device of the present invention.
Figure 4B:
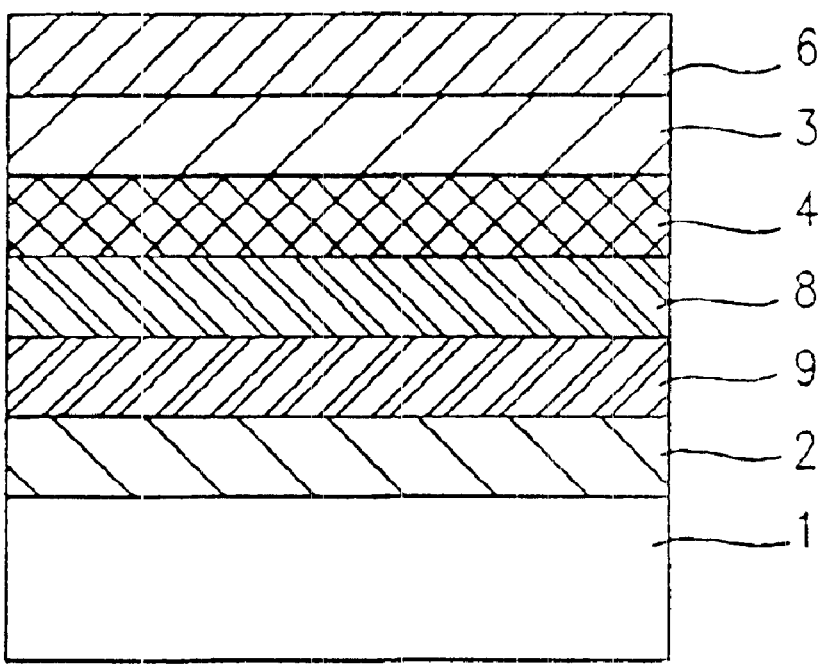
Figure 5:
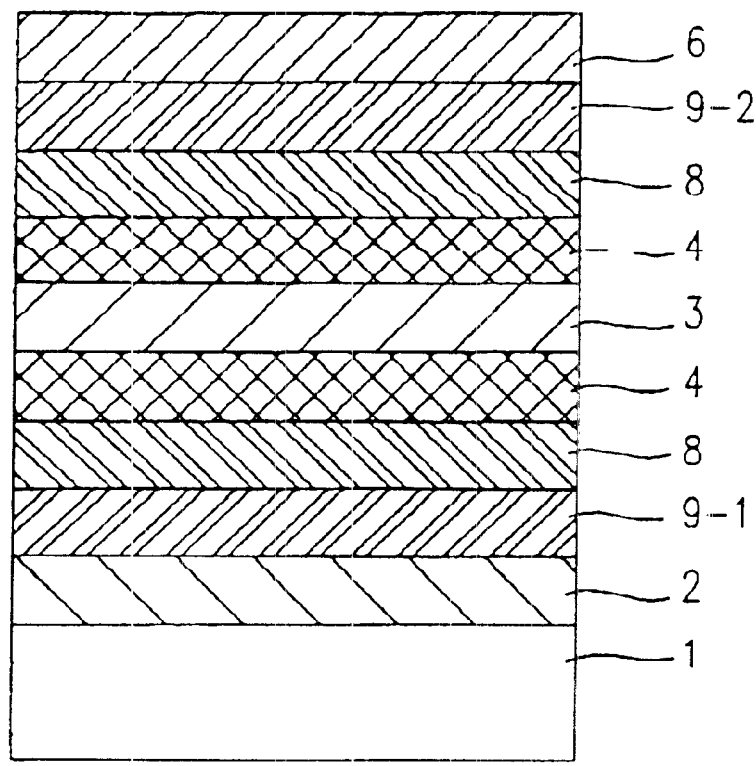
FIG. 5 is a cross-sectional view showing still another embodiment of the magnetoresistive device of the present invention.

In the foregoing description, the present invention has been described as being applied to a case or using a metal reflective layer for a spin-valve film including a hard magnetic layer. Alternatively, the present invention is also applicable to a spin-valve film including an antiferromagnetic layer. In such a case, the magnetization direction of a magnetic layer in contact with the antiferromagnetic layer is fixed. On the other hand, the magnetization direction of a magnetic layer not in contact with the antiferromagnetic layer is changed upon the application of an external magnetic field so that the magnetoresistance thereof is changed. Thus, in order to increase the magnetic field sensitivity with respect to the external magnetic field, a soft magnetic layer is used as the magnetic layer not in contact with the antiferromagnetic layer. FIGS. 4A and 4B and FIG. 5 show exemplary cases.

FIG. 4A shows a structure in which a metal reflective layer 6, a soft magnetic layer 3, a non magnetic layer 4, a magnetic layer 8 and an antiferromagnetic layer 9 are stacked in this order over the substrate 1 via the underlying layer 2. In a conventional spin-valve film, the metal reflective layer 6 shown in FIG. 4A is not provided. The metal reflective layer 6 advantageously increases the MR ratio of the spin-valve film totally in the same way as the spin-valve film using a hard magnetic layer. Thus, the preferable thickness and the preferable material of the metal reflective layer are the same as those described above. Also, in the same way as in the spin-valve film using a hard magnetic layer, it is effective to insert a non-magnetic layer between the metal reflective layer 6 and the soft magnetic layer 3. FIG. 4A shows a case where the stacking of the structure is begun with the metal reflective layer 6. Conversely, the stacking of the structure may be performed in the order of the antiferromagnetic layer 9, the magnetic layer 8, the non-magnetic layer 4, the soft magnetic layer 3 and the metal reflective layer 6 as shown in FIG. 4B.

Fe—Mn, Ni—Mn, Pd—Mn, Pt—Mn, Ir—Mn, Fe—Ir and the like may be used as the materials for the metal antiferromagnetic layer 9. Among these materials, Fe—Mn has been used most frequently in a conventional spin-valve film. However, this material poses some problems in practical use in view of the corrosion resistance and the like of the material. In respect of the corrosion resistance, materials such as Ir—Mn are particularly preferable. The appropriate atomic composition ratio of an $Ir_zMn_{1-z}$ is: $0.1 \leq z \leq 0.5$.

Alternatively, various oxides such as Ni—O, Co—O, Ni O/Co O, Co Ni—O end Fe—O arc usable as the materials for the antiferromagnetic layer 9. Among these oxides, Ni—O and $\alpha$-$Fe_2O_3$ are particularly preferable. Such insulators may realize an even larger MR ratio if the insulation properties thereof are utilized well. In addition, in the case of using the magnetoresistive device for an MR head, the antiferromagnetic layer 9 may be used as a part of a shield gap member. When the antiferromagnetic layer 9 is made of $\alpha$-$Fe_2O_3$, the $\alpha$-$Fe_2O_3$ film can be epitaxially grown over a substrate if a sapphire (11-20) substrate (a so-called A plane) is used as the substrate 1. If an Ni—Fe alloy layer or the like is further formed thereon, then it is possible to apply a uniaxial anisotropy to the [0001] direction within the film plane. Consequently, a sample showing a large MR ratio can be produced.

FIG. 4A shows a case where the metal reflective layer is provided on the soft magnetic layer of the spin-valve film having a structure of a soft magnetic layer, a non-magnetic layer, a magnetic layer and an antiferromagnetic layer. Alternatively, the metal reflective layer may be provided on the antiferromagnetic layer. In such a case, a metal antiferromagnetic material having a conductivity is required to be used for the antiferromagnetic layer, and the film thickness of the antiferromagnetic layer is preferably as small as possible. From this point of view, a material such as Ir—Mn is suitably used as the antiferromagnetic material. The film thickness of the antiferromagnetic layer is preferably in the range from about 5 nm to about 10 nm, both inclusive.

As a material for the magnetic layer 8, Co, Ni—Fe, Ni—Fe—Co or the like is particularly preferable.

A dual spin-valve structure including a first antiferromagnetic layer 9-1, a magnetic layer 8, a non-magnetic layer 4, a soft magnetic layer 3, a non-magnetic layer 4, a magnetic layer 8 and a second antiferromagnetic layer 9-2 is also applicable to the spin-valve film using an antiferromagnetic layer, in the same way as the spin-valve film using a hard magnetic layer. In such a case, if a metal reflective layer is provided on the surface of at least one antiferromagnetic layer as shown in FIG. 5, then the MR ratio can be advantageously increased. In such a case, the antiferromagnetic layer (e.g., 9-2 in FIG. 5) in contact with the metal reflective layer 6 is preferably made of a metal antiferromagnetic material such as Ir—Mn. On the other hand, the antiferromagnetic layer (e.g., 9-1 in FIG. 5) not in contact with the metal-reflective layer is suitably made of an insulating antiferromagnetic material, e.g., an oxide such as Ni—O. In such a case, if a non magnetic layer is provided between the metal reflective layer and the antiferromagnetic layer, then the non-magnetic layer further increases the MR ratio advantageously.

Each of the above-described layers 2 to 8 and the substrate 1 may be formed by a sputtering method or an evaporation method. In either case, the magnetoresistive device of the present invention can be fabricated. Various sputtering techniques including a DC sputtering, an RF sputtering and an ion beam sputtering are applicable. In any of these techniques, the magnetoresistive device of the present invention can be fabricated. On the other hand, in the case of using an evaporation method, a ultrahigh vacuum evaporation technique is particularly preferable.

Figure 6:
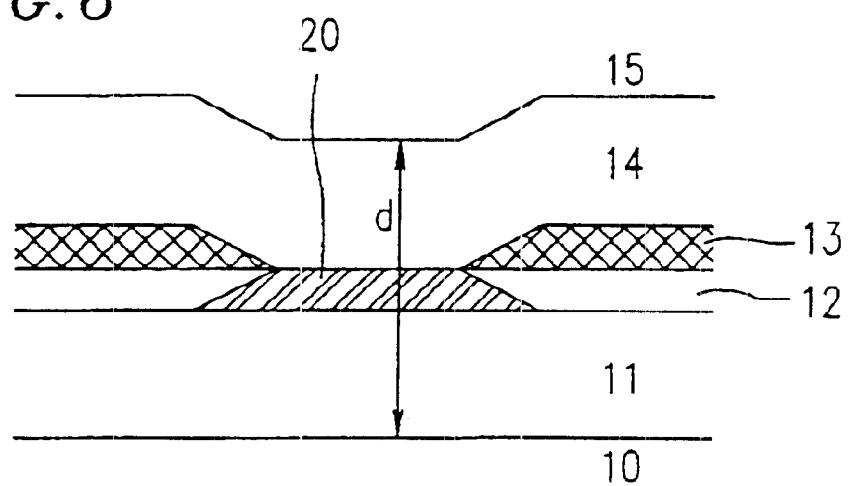
FIG. 6 is a cross-sectional view showing an exemplary configuration of the magnetoresistive head of the present invention.

A magnetoresistive head (hereinafter, simply referred to as an "MR head") can be formed by using the above-described magnetoresistive device of the present invention. An exemplary structure of an MR head of a hard film biasing type is shown in FIG. 6. As shown in FIG. 6, an MR device portion 20 is formed so as to be interposed between an upper shield gap 14 and a lower shield cap 11. Insulating films made of $Al_2O_3$, $SiO_4$ or the like are usable as the shield gaps 11 and 14. A pair of shields 10 and 15 are further formed on the outer side of the lower shield gap 11 and on the outer side of the upper shield gap 14, respectively. Soft magnetic layers made of an Ni—Fe alloy or the like are used as the shields 10 and 15. In order to control the magnetic domain of the MR device portion 20, hard biasing portions 12 applying a biasing magnetic field are formed of a hard film made of a Co-Pt alloy or the like. Herein, a hard film is assumed to be used for applying a biasing magnetic field. Alternatively, an antiferromagnetic material such as Fe—Mn may also be used. The MR device portion 20 is electrically insulated from the shields 10 and 15 via the shield gaps 11 and 14, respectively. By supplying current through lead portions 13, the resistance change in the MR device portion 20 can be detected.

In order to realize a ultrahigh density for a hard disk drive in the near future, the recording wavelength of the MR device 20 is required to be shortened. Thus, the distance d between the shields 10 and 15 shown in FIG. 6 is required to be reduced, which in turn requires the reduction in thickness of the MR device portion 20 as is clear from FIG. 6. The thickness of the MR device portion 20 is preferably at most about 20 nm.

In addition, in order to prevent a Barkhausen noise from being generated when the magnetization direction of a soft magnetic layer is inverted, the MR device 20 shown in FIG. 6 is preferably configured such that the direction of the magnetization easy axis of the soft magnetic layer 3 shown in FIG. 1A through FIG. 5 is vertical to the direction of a signal magnetic field to be detected.

Hereinafter, specific examples of the magnetoresistive device and the magnetoresistive head of the present invention will be described.

EXAMPLE 1

Spin-valve devices of the types shown in FIGS. 1A to 1C using a hard magnetic layer were fabricated by using an MgO (100) single crystalline substrate as the substrate 1 in accordance with a ultrahigh vacuum evaporation method, and the MR properties thereof were evaluated. An $Ni_{0.8}Fe_{0.2}$ alloy (where the composition is represented by an atomic composition ratio) was used for the soft magnetic layer 3, Co was used for the hard magnetic layer 5, Cu was used for the non-magnetic layer 4, and Ag or Au was used for the metal reflective layer 6. An electron beam evaporation source was used as an evaporation source for depositing Ni—Fe; Co and Pt and a K cell was used as an evaporation source for Cu, Ag and Au.

First, the temperature of the MgO substrate 1 was held at about 500° C. within a ultrahigh vacuum evaporation apparatus, thereby epitaxially growing a Pt film as a first underlying layer to be about 10 nm thick on the substrate. Then, after the temperature of the substrate 1 had been lowered to room temperature, a Cu layer was formed as a second underlying layer to be about 5 nm thick. After the surface condition of the sample was improved by heating the sample at about 200° C. for about 30 minutes, spin-valve films shown in the following Table 1—1 were formed at room temperature.

The heat treatment conducted at about 200° C. after the Cu underlying layer had been formed was of significance for obtaining a smooth surface. This is because the MR ratio was small when a spin-valve device was formed on an underlying layer which had not been subjected to the heat treatment. It is noted that, in Table 1—1, the underlying portion including MgO/Pt(10 nm)/Cu(5 nm) is omitted from all the spin-valve films.

TABLE 1-1

| No. | Structure of Sample | MR Ratio |
|---|---|---|
| A1 | Ni—Fe(3nm)/Cu(2.1nm)/Co(3nm) | 2.8% |
| A2 | Ni—Fe(3nm)/Cu(2.1nm)/Co(3nm)/Ag(2nm) | 3.9% |
| A3 | Ni—Fe(3nm)/Cu(2.1nm)/Co(3nm)/Cu(1.2nm) | 2.4% |
| A4 | Ni—Fe(3nm)/Cu(2.1nm)/Co(3nm)/Cu(1.2nm)/Ag(2nm) | 5.1% |
| A5 | Ni—Fe(3nm)/Cu(2.1nm)/Co(3nm)/Cu(1.2nm)/Pt(2nm) | 1.9% |
| A6 | Ni—Fe(3nm)/Cu(2.1nm)/Co(3nm)/Cu(1.2nm)/Au(2nm) | 4.7% |

According to in-situ-monitored RHEED (reflection high energy electron diffraction) patterns, the (100) plane was grown in the direction parallel to the surface of the substrate (or the surface of the film) for Ni—Fe, Cu, Co and Pt, while the (111) plane was mainly grown in the direction parallel to the surface of the films for Ag and Au, in all of the samples A1 to A6.

The surface of the fabricated devices was observed by a scanning tunneling microscope (STM). As a result, in the sample A4, parts where a highly flat surface having an unevenness on the order of about 0.2 nm was formed within a vision of about 10×10 nm occupies 50% or more of the entire surface. On the other hand, the surface roughness of the device observed in a similar manner was about 0.7 nm for the sample A3 and about 0.3 nm for the sample A2.

The properties of the devices thus fabricated were evaluated in accordance with a direct current four terminal method by applying an external magnetic field having an intensity of about 500 Oe (40 kA/m) at room temperature. The evaluation results are also shown in Table 1—1. As can be seen from Table 1—1, the MR ratio of a conventional example having a simple spin-valve structure (i.e., the sample A1) is low. On the other hand, the MR ratio of an example of the present invention (i.e., the sample A2) having a structure shown in FIG. 1A, in which an Ag layer is additionally provided as a metal reflective layer for the structure of the sample A1, is increased by about 1%. However, even if the metal reflective layer made of Ag is replaced by a layer made of Cu or the like as in a comparative example (i.e., the sample A3), the MR ratio is decreased to the contrary, as compared with the conventional example (i.e., the sample A1).

However, if an Ag layer is additionally provided on the Cu layer of the structure of the sample A3 as shown in FIG. 1B, then the MR ratio of such an example (i.e., the sample A4) is even larger than that of the sample A2. Even if an Au layer is formed instead of the Ag layer of the sample A4, substantially the same effects as those attained by the sample A4 can be attained and the MR ratio of such an example (i.e., the sample A6) is also high. Nevertheless, if Pt is used instead of Ag, the MR ratio of such a comparative example (i.e., the sample A5) is low.

In the foregoing example, a soft magnetic layer is formed prior to the formation of a hard magnetic layer. However, the same effects are also attained even when the hard magnetic layer is formed prior to the formation of the soft magnetic layer as shown in FIG. 1C. The results of such a case are shown in the following Table 1-2. It is noted that, in Table 1-2, the underlying portion including MgO/Pt(10 nm)/Cu(5 nm) is also omitted from all the spin-valve films, in the same way as in Table 1—1.

TABLE 1-2

| No. | Structure of Sample | MR Ratio |
|---|---|---|
| A7 | Co(3nm)/Cu(2.1nm)/Ni—Fe(3nm) | 3% |
| A8 | Ag(2nm)/Co(3nm)/Cu(2.1nm)/Ni—Fe(3nm) | 4.5% |
| A9 | Ag(2nm)/Cu(1nm)/Co(3nm)/Cu(2.1nm)/Ni Fe((3nm) | 5.5% |

As can be seen from Table 1-2, the MR ratios of the examples of the present invention (i.e., the samples A8 and A9) in which the hard magnetic layer is provided to be closer to the substrate are larger than that of a conventional spin-valve film (i.e., the sample A7).

In the foregoing example, a metal reflective layer is assumed to be provided on the hard magnetic layer. However, the same effects can be attained when the metal reflective layer is provided on the soft magnetic layer, as shown in FIG. 2A. The spin-valve devices shown in the following Table 1-3 were fabricated and the MR properties thereof were evaluated in the same way as in Tables 1—1 and 1-2.

TABLE 1-3

| No. | Structure of Sample | MR Ratio |
|-----|---------------------|----------|
| A10 | Co(5nm)/Cu(2.1nm)/Ni—Fe(5nm) | 4.0% |
| A11 | Co(5nm)/Cu(2.1nm)/Ni—Fe(5nm)/Ag(3nm) | 5.6% |
| A12 | Co(5nm)/Cu(2.1nm)/Ni—Fe(5nm)/Cu(1.2nm) | 3.2% |
| A13 | Co(5nm)/Cu(2.1nm)/Ni—Fe(5nm)/Cu(1.2nm)/Ag(3nm) | 7.1% |

As is clear from the results shown in Table 1-3, the MR ratios of the examples of the present invention (i.e., the samples A11 and A13) are higher than those of the conventional examples (i.e., samples A10 and A12).

In Table 1-3, the stacking of a structure is assumed to be begun with the hard magnetic layer. Even when the stacking of a structure was begun with the soft magnetic layer, the samples were fabricated and the MR properties thereof were evaluated in the same way. The results are shown in the following Table 1-4.

TABLE 1-4

| No. | Structure of Sample | MR Ratio |
|-----|---------------------|----------|
| A14 | Ni—Fe(5nm)/Cu(2.1nm)/Co(5nm) | 4.2% |
| A15 | Ag(1nm)/Ni—Fe(5nm)/Cu(2.1nm)/Co(5nm) | 5.5% |
| A16 | Cu(1nm)/Ni—Fe(5nm)/Cu(2.1nm)/Co(5nm) | 3.3% |
| A17 | Ag(1nm)/Cu(1nm)/Ni—Fe(5nm)/Cu(2.1nm)/Co(5nm) | 6.2% |

As is clear from the results shown in Table 1-4, the MR ratios of the examples of the present invention (i.e., the samples A15 and A17) are higher than those of the conventional examples (i.e., the samples A14 and A16).

Next, dual spin-valve films of the type shown in FIG. 3 were formed after the underlying layers had been formed in the same way as in the case of Table 1—1. The structures of the samples and the measurement results of the MR ratios thereof are shown in the following Table 1-5.

TABLE 1-5

| No. | Structure of Sample | MR Ratio |
|-----|---------------------|----------|
| A18 | Co(3nm)/Cu(2.1nm)/Ni—Fe(3nm)/Cu(2.1nm)/Co(3nm) | 6.2% |
| A19 | Ag(1nm)/Co(3nm)/Cu(2.1nm)/Ni—Fe(3nm)/Cu(2.1nm)/Co(3nm)/Ag(1nm) | 8.3% |
| A20 | Ag(1nm)/Cu(1nm)/Co(3nm)/Cu(2.1nm)/Ni—Fe(3nm)/Cu(2.1nm)/Co(3nm)/Ag(1nm) | 10.1% |

As is clear from the results shown in Table 1-5, the MR ratios of the examples of the spin-valve device of the present invention (i.e., the samples A19, and A20) are higher than that of the conventional example (i.e., the samples A18).

EXAMPLE 2

Spin-valve devices of the type shown in FIG. 2B having a fundamental structure of Ni—Fe/Cu/Co were fabricated by using an Si (111) single crystalline substrate in accordance with a ultrahigh vacuum evaporation method. First, the Si substrate was immersed in an aqueous solution of HF, a naturally oxidized layer on the surface thereof was removed and then the substrate was installed into a ultrahigh vacuum evaporation apparatus. The respective thin films were formed in conformity with the method described in Example 1, above.

Specifically, an Ag layer was epitaxially grown as a metal reflective layer to be about 7 nm thick on the Si substrate. Then, the temperature of the substrate was held at about 100° C. for about 20 minutes. Thereafter, the temperature of the substrate was lowered to room temperature, and a Cu layer was formed as a non-magnetic layer to be about 5 nm thick. Subsequently, the substrate was heated again to about 200° C. and the temperature was held for about 20 minutes.

The heat treatment conducted after the Ag layer and the Cu layer had been formed was of great significance for obtaining a smooth surface. Thereafter, the temperature of the substrate was lowered to room temperature and then a structure of Ni—Fe/Cu/Co/Cu/Ag was formed.

The structures of the spin-valve films thus fabricated and the MR ratios thereof measured in the same way as in the first example are shown in the following Table 2. It is noted that, in Table 2, the common underlying portion including Si/Ag(7 nm)/Cu(5 nm) is omitted from all the spin-valve films.

TABLE 2

| No. | Structure of Sample | MR Ratio |
|-----|---------------------|----------|
| B1 | Ni—Fe(2nm)/Cu(3nm)/Co(2nm) | 3.4% |
| B2 | Ni—Fe(2nm)/Cu(3nm)/Co(2nm)/Ag(5nm) | 5.2% |
| B3 | Ni—Fe(2nm)/Cu(3nm)/Co(2nm)/Cu(0.5nm)/Ag(5nm) | 6.1% |
| B4 | Ni—Fe(2nm)/Cu(3nm)/Co(2nm)/Cu(0.5nm)/Au(5nm) | 5.8% |

In Table 2, the MR ratio of the example (i.e., the sample B1) is an ordinary one because the underlying layer thereof is a metal reflective layer. However, when metal reflective layers were formed on both surfaces of a spin-valve film as in the example (i.e., the sample B2) shown in FIG. 2B, the MR ratio was increased. If a Cu layer is inserted as a non-magnetic layer between the magnetic layer made of Co and the metal reflective layer made of Ag, Then the MR ratio is further increased (i.e., the sample B3). It is noted that metal reflective layers made of different materials or of different thicknesses may be formed on the respective surfaces of the spin-valve film. For example, as in the sample B4, one of the metal reflective layers may be an Ag layer epitaxially grown on the Si substrate, while the other metal reflective layer may be an Au layer.

EXAMPLE 3

Magnetoresistive devices of the type shown in FIG. 4A were fabricated on a water cooled glass substrate via a Ta underlying layer having a thickness of about 3 nm by the use of an RF magnetron sputtering apparatus using a hexad target. Various types of devices were fabricated by changing the composition of the metal reflective layer shown in FIG. 4A in various manners and the MR ratios thereof were measured by the same method as that of the first example. The results are shown in the following Table 3 (where the composition of each alloy is represented by the atomic composition ratio of the target).

TABLE 3

| No. | Structure of Sample | MR Ratio |
|-----|---------------------|----------|
| C1 | $Ni_{0.8}Co_{0.1}Fe_{0.1}$(5nm)/Cu(2nm)/Co(2nm)/$Ir_{0.2}Mn_{0.8}$(8nm) | 4.0% |
| C2 | Cu(1nm)/$Ni_{0.8}Co_{0.1}Fe_{0.1}$(5nm)/Cu(2nm)/Co(2nm)/$Ir_{0.2}Mn_{0.8}$(8nm) | 3.3% |
| C3 | Ag(1nm)/$Ni_{0.8}Co_{0.1}Fe_{0.1}$(5nm)/Cu(2nm)/Co(2nm)/$Ir_{0.2}Mn_{0.8}$(8nm) | 5.2% |

TABLE 3-continued

| No. | Structure of Sample | MR Ratio |
|---|---|---|
| C4 | Ag(1nm)/Cu(1nm)/Ni$_{0.8}$Co$_{0.1}$Fe$_{0.1}$(5nm)/Cu(2nm)/ Co(2nm)/Ir$_{0.2}$Mn$_{0.8}$(8nm) | 6.1% |
| C5 | Au(1nm)/Cu(1nm)/Ni$_{0.8}$Co$_{0.1}$Fe$_{0.1}$(5nm)/Cu(2nm)/ Co(2nm)/Ir$_{0.2}$Mn$_{0.8}$(8nm) | 5.8% |
| C6 | Bi(1nm)/Cu(1nm)/Ni$_{0.8}$Co$_{0.1}$Fe$_{0.1}$(5nm)/Cu(2nm)/ Co(2nm)/Ir$_{0.2}$Mn$_{0.8}$(8nm) | 5.1% |
| C7 | Sn(1nm)/Cu(1nm)/Ni$_{0.8}$Co$_{0.1}$Fe$_{0.1}$(5nm)/Cu(2nm)/ Co(2nm)/Ir$_{0.2}$Mn$_{0.8}$(8nm) | 4.8% |
| C8 | Pb(1nm)/Cu(1nm)/Ni$_{0.8}$Co$_{0.1}$Fe$_{0.1}$(5nm)/Cu(2nm)/ Co(2nm)/Ir$_{0.2}$Mn$_{0.8}$(8nm) | 5.2% |

As can be understood from Table 3, the MR ratios of the examples of the spin-valve device of the present invention (i.e., the samples C3 to C8) using a metal reflective layer are higher than those of the conventional examples (i.e., the samples C1 and C2). Au, Ag, Bi, Sn or Pb is appropriate as a material for the metal reflective layer. Among these materials, Au and Ag are particularly preferable and Ag is most preferable.

Next, MR heads of the type shown in FIG. 6 were formed by using the samples C3 and C4 of the present invention and the conventional sample C1 as the MR device portion 20 and the properties of the MR heads were evaluated. In this case, the substrate was made of Al$_2$O$_3$-TiC, the lower and the upper shields 10 and 15 were made of an Ni$_{0.8}$Fe$_{0.2}$ alloy, the lower and the upper shield gaps 11 and 14 were made of Al$_2$O$_3$, the hard biasing portion 12 was made of a Co—Pt alloy and the lead portion 13 was made of Au. In addition, an anisotropy was determined such that the direction of the magnetization easy axis of the soft magnetic layer and that of the magnetization easy axis of a magnetic layer which had received an exchange anisotropy from the antiferromagnetic layer respectively became vertical and parallel to the direction of the signal magnetic field to be detected.

In this method, when a magnetic layer was deposited, a magnetic field was applied by a permanent magnet to the direction within the film to which an anisotropy was desirably applied. When the outputs of these MR heads were measured by applying an AC signal magnetic field of about 200 e to these heads, the outputs of the MR heads of the present invention (i.e., the samples C3 and C4) were higher than that of a conventional MR head using the sample C1 by about 30% and about 60%, respectively.

EXAMPLE 4

Magnetoresistive devices of the type shown in FIG. 4B were fabricated on a water cooled glass substrate by the use of an RF magnetron sputtering apparatus using a hexad target in the same way as in the third example. The MR ratios thereof were measured by the same method as that of the first example. The results are shown in the following Table 4-1 (where the composition of each alloy is represented by the atomic composition ratio of the target).

TABLE 4-1

| No. | Structure of Sample | MR Ratio |
|---|---|---|
| D1 | NiO(50nm)/Ni$_{0.3}$Co$_{0.6}$Fe$_{0.1}$(5nm)/Cu(2nm)/ Ni$_{0.3}$Co$_{0.6}$Fe$_{0.1}$(5nm) | 4.0% |
| D2 | NiO(50nm)/Ni$_{0.3}$Co$_{0.6}$Fe$_{0.1}$(5nm)/Cu(2nm)/ Ni$_{0.3}$Co$_{0.6}$Fe$_{0.1}$(5nm)/Ag(3nm) | 5.5% |

TABLE 4-1-continued

| No. | Structure of Sample | MR Ratio |
|---|---|---|
| D3 | NiO(50nm)/Ni$_{0.3}$Co$_{0.6}$Fe$_{0.1}$(5nm)/Cu(2nm)/ Ni$_{0.3}$Co$_{0.6}$Fe$_{0.1}$(5nm)/Cu(1nm) | 3.3% |
| D4 | NiO(50nm)/Ni$_{0.3}$Co$_{0.6}$Fe$_{0.3}$(5nm)/Cu(2nm)/ Ni$_{0.3}$Co$_{0.6}$Fe$_{0.1}$(5nm)/Cu(1nm)/Ag(3 | 6.3% |

As can be understood from Table 4-1, the MR ratios of the examples of the spin-valve device of the present invention (i.e., the samples D2 and D4) using a metal reflective layer are higher than those of the conventional examples of the spin-valve film (i.e., the samples D1 and D3).

Next, the spin-valve films of the type including a metal reflective layer on the antiferromagnetic layer were fabricated in totally the same way as the samples shown in Table 4-1.

TABLE 4-2

| No. | Structure of Sample | MR Ratio |
|---|---|---|
| D5 | Ni$_{0.8}$Fe$_{0.2}$(5nm)/Cu(2.5nm)/Co(2nm)/Ir$_{0.2}$Mn$_{0.8}$(8nm) | 3.3% |
| D6 | Ni$_{0.8}$Fe$_{0.2}$(5nm)/Cu(2.5nm)/Co(2nm)/Ir$_{0.2}$Mn$_{0.8}$(8nm)/ Ag(1nm) | 4.0% |
| D7 | Ni$_{0.8}$Fe$_{0.2}$(5nm)/Cu(2.5nm)/Co(2nm)/Ir$_{0.2}$Mn$_{0.8}$(8nm)/ Cu(1nm) | 2.4% |
| D8 | Ni$_{0.8}$Fe$_{0.2}$(5nm)/Cu(2.5nm)/Co(2nm)/Ir$_{0.2}$Mn$_{0.8}$(8nm)/ Cu(1nm)/Ag(1nm) | 4.8% |

As can be understood from Table 4-2, the MR ratios of the examples of the spin-valve device of the present invention (i.e., the samples D6 and D8) using a metal reflective layer are higher than those of the conventional examples of the spin-valve film (i.e., the samples D5 and D7).

Next, MR heads of the type shown in FIG. 6 were formed by using the samples D2 and D4 of the present invention and the conventional sample D1 as the MR device portion 20 and the properties of the MR heads were evaluated. In this case, the substrate was made of Al$_2$O$_3$-TiC, the lower and the upper shields 10 and 15 were made of an Ni$_{0.8}$Fe$_{0.2}$ alloy, an NiO film (about 50 nm) as an insulating film was used in common for the lower shield gap 11 with the device portion, the upper shield gap 14 was made of Al$_2$O$_3$, the hard biasing portion 12 was made of a Co—Pt alloy and the lead portion 13 was made of Au. In addition, an anisotropy was determined such that the direction of the magnetization-easy axis of the soft magnetic layer and that of the magnetization-easy axis of a magnetic layer which had received an exchange anisotropy from the antiferromagnetic layer respectively became vertical and parallel to the direction of the signal magnetic field to be detected.

In this method, when a magnetic layer was deposited, a magnetic field was applied by a permanent magnet to the direction within the film to which an anisotropy was desirably applied. When the outputs of these MR heads were measured by applying an AC signal magnetic field of about 200 e to these heads, the outputs of the MR heads of the present invention (i.e., the samples D2 and D4) were higher than that of a conventional MR head using the sample D1 by about 35% and about 50%, respectively.

EXAMPLE 5

Magnetoresistive devices of the type shown in FIG. 5 were fabricated on a water cooled glass substrate by the use of an RF magnetron sputtering apparatus using a hexad target. The MR ratios thereof were measured by the same method as that of Example 1. The results are shown in the following Table 5 (where the composition of each alloy is represented by the atomic composition ratio of the target).

TABLE 5

| No. | Structure of Sample | MR Ratio |
|---|---|---|
| E1 | NiO(50nm)/Ni$_{0.8}$Fe$_{0.2}$(5nm)/Cu(2nm)/Ni$_{0.8}$Fe$_{0.2}$(5nm)/ Cu(2nm)/Ni$_{0.8}$Fe$_{0.2}$(5nm)/Ir$_{0.2}$Mn$_{0.8}$(8nm) | 6% |
| E2 | NiO(50nm)/Ni$_{0.8}$Fe$_{0.2}$(5nm)/Cu(2nm)/Ni$_{0.8}$Fe$_{0.2}$(5nm)/ Cu(2nm)/Ni$_{0.8}$Fe$_{0.2}$(5nm)/Ir$_{0.2}$Mn$_{0.8}$(8nm)/Ag(3nm) | 8.3% |
| E3 | NiO(50nm)/Ni$_{0.8}$Fe$_{0/2}$(5nm)/Cu(2nm)/Ni$_{0.8}$Fe$_{0.2}$(5nm)/ Cu(2nm)/Ni$_{0.8}$Fe$_{0.2}$(5nm)/Ir$_{0.2}$Mn$_{0.8}$(8nm)/Cu(1nm) | 4.4% |
| E4 | NiO(50nm)/Ni$_{0.8}$Fe$_{0.2}$(5nm)/Cu(2nm)/Ni$_{0.8}$Fe$_{0.2}$(5nm)/ Cu(2nm)/Ni$_{0.8}$Fe$_{0.2}$(5nm)/Ir$_{0.2}$Mn$_{0.8}$(8nm)/Cu(1nm)/ Ag(3nm) | 9.9% |

As can be understood from Table 5, the MR ratios of the examples of the spin-valve device of the present invention (i.e., the samples E2 and E4) using a metal reflective layer are higher than those of the conventional examples of the spin-valve film (i.e., the samples E1 and E3).

Next, MR heads of the type shown in FIG. 6 were formed by using the samples E2 and E4 of the present invention and the conventional sample E1 as the MR device portion 20 and the properties of the MR heads were evaluated. In this case, the substrate was made of Al$_2$O$_3$-TiC, the lower and the upper shields 10 and 15 were made of an Ni$_{0.8}$Fe$_{0.2}$ alloy, an NiO film (about 50 nm) as an insulating film was used in common for the lower shield gap 11 with the device portion, the upper shield gap 14 was made of Al$_2$O$_3$, the hard biasing portion 12 was made of a Co—Pt alloy and the lead portion 13 was made of Au. In addition, an anisotropy was determined such that the direction of the magnetization-easy axis of the soft magnetic layer and that of the magnetization-easy axis of a magnetic layer which had received an exchange anisotropy from the antiferromagnetic layer respectively became vertical and parallel to the direction of the signal magnetic field to be detected.

In this method, when a magnetic layer was deposited, a magnetic field was applied by a permanent magnet to the direction within the film to which an anisotropy was desirably applied. When the outputs of these MR heads were measured by applying an AC signal magnetic field of about 200 e to these heads, the outputs of the MR heads of the present invention (i.e., the samples E2 and E4) were higher than that of the conventional MR head using the sample E1 by about 40% and about 80%, respectively.

EXAMPLE 6

Magnetoresistive devices of the type shown in the following Table 6 were fabricated on a water cooled glass substrate by the use of an RF magnetron sputtering apparatus using a hexad target. The MR ratios thereof were measured by the same method as that of Example 1. The results are shown in Table 6 (where the composition of each alloy is represented by the atomic composition ratio of the target).

TABLE 6

| No. | Structure of Sample | MR Ratio |
|---|---|---|
| F1 | Ir$_{0.2}$Mn$_{0.8}$(8nm)/Ni$_{0.8}$Fe$_{0.2}$(5nm)/Cu(2nm)/Ni$_{0.8}$Fe$_{0.2}$(5nm)/ Cu(2nm)/Ni$_{0.8}$Fe$_{0.2}$(5nm)/Ir$_{0.2}$Mn$_{0.8}$(8nm) | 4.5% |
| F2 | Ag(3nm)/Ir$_{0.2}$Mn$_{0.8}$(8nm)/Ni$_{0.8}$Fe$_{0.2}$(5nm)/Cu(2nm)/ Ni$_{0.8}$Fe$_{0.2}$(5nm)/Cu(2nm)/Ni$_{0.8}$Fe$_{0.2}$(5nm)/Ir$_{0.2}$Mn$_{0.8}$(8nm)/ Ag(3nm) | 5.5% |

TABLE 6-continued

| No. | Structure of Sample | MR Ratio |
|---|---|---|
| F3 | Cu(1nm)/Ir$_{0.2}$Mn$_{0.8}$(8nm)/Ni$_{0.8}$Fe$_{0.2}$(5nm)/Cu(2nm)/ Ni$_{0.8}$Fe$_{0.2}$(5nm)/Cu(2nm)/Ni$_{0.8}$Fe$_{0.2}$(5nm)/IR$_{0.2}$Mn$_{0.8}$(8nm)/ Cu(1nm) | 3.9% |
| F4 | Ag(3nm)/Cu(1nm)/Ir$_{0.2}$Mn$_{0.8}$(8nm)/Ni$_{0.8}$Fe$_{0.2}$(5nm)/ Cu(2nm)/Ni$_{0.8}$Fe$_{0.2}$(5nm)/Cu(2nm)/Ni$_{0.8}$Fe$_{0.2}$(5nm)/ Ir$_{0.2}$Mn$_{0.8}$(8nm)/Cu(1nm)/Ag(3nm) | 7.1% |

As can be understood from Table 6, the MR ratios of the examples of the spin-valve device of the present invention (i.e., the samples F2 and F4) using a metal reflective layer are higher than those of the conventional examples of the spin-valve film (i.e., the samples F1 and F3).

EXAMPLE 7

Magnetoresistive device of the type shown in FIG. 4B were fabricated on a water cooled glass substrate by the use of an RF magnetron sputtering apparatus using a hexad target in the same way as in Example 3. The MR ratios thereof were measured by the same method as that of Example 1. The results are shown in the following Table 7 (where the composition of each alloy is represented by the atomic composition ratio of the target).

TABLE 7

| No. | Structure of Sample | MR Ratio |
|---|---|---|
| G1 | Fe$_2$O$_3$(50nm)/Co(5nm)/Cu(2.2nm)/Ni$_{0.3}$Co$_{0.6}$Fe$_{0.1}$(5nm) | 3.8% |
| G2 | Fe$_2$O$_3$(50nm)/Co(5nm)/Cu(2.2nm)/Ni$_{0.3}$Co$_{0.6}$Fe$_{0.1}$(5nm)/ Ag(2nm) | 5.4% |
| G3 | Fe$_2$O$_3$(50nm)/Co(5nm)/Cu(2.2nm)/Ni$_{0.3}$Co$_{0.6}$Fe$_{0.1}$(5nm)/ Cu(1nm) | 3.1% |
| G4 | Fe$_2$O$_3$(50nm)/Co(5nm)/Cu(2.2nm)/Ni$_{0.3}$Co$_{0.6}$Fe$_{0.1}$(5nm)/ Cu(1nm)/Ag(2nm) | 6.2% |
| G5 | Fe$_2$O$_3$(50nm)/Co(5nm)/Cu(2.2nm)/Ni$_{0.3}$Co$_{0.6}$Fe$_{0.1}$(2nm)/ Cu(1nm)/Ni$_{0.3}$Co$_{0.6}$Fe$_{0.1}$(2nm)/Cu(1nm)/Ag(2nm) | 6.0% |

As can be understood from Table 7, the MR ratios of the examples of the spin-valve device of the present invention using a metal reflective layer (i.e., the samples G2, G4 and G5) are higher than those of the conventional examples of the spin-valve film (i.e., the samples G1 and G3). As compared with the sample G4, the sample G5 showed a substantially equal MR ratio, but the coercivity of the soft magnetic layer of the sample G5 decreased from about 100 e to about 50 e. By forming a soft magnetic layer of two or more layers which are stacked via a non-magnetic layer in this manner, the soft magnetic properties thereof can be improved and the magnetic field sensitivity can be increased.

Next, MR heads of the type shown in FIG. 6 were formed by using the samples G2 and G4 of the present invention and the conventional sample G1 as the MR device portion 20 and the properties of the MR heads were evaluated. In this case, the substrate was made of Al$_2$O$_3$-TiC, the lower and the upper shields 10 and 15 were made of an Ni$_{0.8}$Fe$_{0.2}$ alloy, an Fe$_2$O$_3$ film (about 50 nm) as an insulating film was used in common for the lower shield gap 11 with the device portion, the upper shield gap 14 was made of Al$_2$O$_3$, the hard biasing portion 12 was made of a Co—Pt alloy and the lead portion 13 was made of Au. In addition, an anisotropy was determined such that the direction of the magnetization-easy axis of the soft magnetic layer and that of the magnetization-easy axis of a magnetic layer which had received an exchange anisotropy from the antiferromagnetic layer respectively became vertical and parallel to the direction of the signal magnetic field to be detected.

In this method, when a magnetic layer was deposited, a magnetic field was applied by a permanent magnet to the direction within the film to which an anisotropy was desirably applied. When the outputs of these MR heads were measured by applying an AC signal magnetic field of about 200 e to these heads, the outputs of the MR heads of the present invention (i.e., the samples G2 and G4) were higher than that of a conventional MR head using the sample G1 by about 30% and about 45%, respectively.

EXAMPLE 8

Magnetoresistive devices of the type shown in FIG. 5 were fabricated on a water cooled glass substrate by the use of an RF magnetron sputtering apparatus using a hexad target. The MR ratios thereof were measured by the same method as that of Example 1. The results are shown in the following Table 8 (where the composition of each alloy is represented by the atomic composition ratio of the target).

TABLE 8

| No. | Structure of Sample | MR Ratio |
| --- | --- | --- |
| H1 | $Fe_2O_3$(50nm)/$Ni_{0.8}Fe_{0.2}$(4nm)/Cu(2nm)/$Ni_{0.8}Fe_{0.2}$(6nm)/ Cu(2nm)/$Ni_{0.8}Fe_{0.2}$(5nm)/$Ir_{0.2}Mn_{0.8}$(8nm) | 5.5% |
| H2 | $Fe_2O_3$(50nm)/$Ni_{0.8}Fe_{0.2}$(4nm)/Cu(2nm)/$Ni_{0.8}Fe_{0.2}$(6nm)/ Cu(2nm)/$Ni_{0.8}Fe_{0.2}$(5nm)/$Ir_{0.2}Mn_{0.8}$(8nm)/Ag(3nm) | 7.5% |
| H3 | $Fe_2O_3$(50nm)/$Ni_{0.8}Fe_{0.2}$(4nm)/Cu(2nm)/$Ni_{0.8}Fe_{0.2}$(6nm)/ Cu(2nm)/$Ni_{0.8}Fe_{0.2}$(5nm)/$Ir_{0.2}Mn_{0.8}$(8nm)/Cu(1nm) | 4.1% |
| H4 | $Fe_2O_3$(50nm)/$Ni_{0.8}Fe_{0.2}$(4nm)/Cu(2nm)/$Ni_{0.8}Fe_{0.2}$(6nm)/ Cu(2nm)/$Ni_{0.8}Fe_{0.2}$(5nm)/$Ir_{0.2}Mn_{0.8}$(8nm)/Cu(1nm)/ Ag(3nm) | 9.0% |
| H5 | $Fe_2O_3$(50nm)/$Ni_{0.8}Fe_{0.2}$(4nm)/Cu(2nm)/ $Ni_{0.8}Fe_{0.2}$(1.5nm)/Cu(0.8nm)/$Ni_{0.8}Fe_{0.2}$(1.5nm)/ Cu(0.8nm)/$Ni_{0.8}Fe_{0.2}$(1.5nm)/Cu(2nm)/$Ni_{0.8}Fe_{0.2}$(5nm)/ $Ir_{0.2}Mn_{0.8}$(8nm)/Cu(1nm)/Ag(2nm) | 9.2% |

As can be understood from Table 8, the MR ratios of the examples of the spin-valve device of the present invention using a metal reflective layer (i.e., the samples H2, H4 and H5) are higher than those of the conventional examples of the spin-valve film (i.e., the samples H1 and H3). As compared with the sample H4, the sample H5 showed a substantially equal MR ratio, but the coercivity of the soft magnetic layer of the sample H5 decreased from about 90 e to about 30 e. By forming a soft magnetic layer of two or more layers which are stacked via a non-magnetic layer in this manner, the soft magnetic properties thereof can be improved and the magnetic field sensitivity can be increased.

Next, MR heads of the type shown in FIG. 6 were formed by using the samples H2 and H4 of the present invention and the conventional sample H1 as the MR device portion 20 and the properties of the MR heads were evaluated. In this case, the substrate was made of $Al_2O_3$-TiC, the lower and the upper shields 10 and 15 were made of an $Ni_{0.8}Fe_{0.2}$ alloy, an $Fe_2O_3$ film (about 50 nm) as an insulating film was used in common for the lower shield gap 11 with the device portion, the upper shield gap 14 was made of $Al_2O_3$, the hard biasing portion 12 was made of a Co—Pt alloy and the lead portion 13 was made of Au.

In addition, an anisotropy was determined such that the direction of the magnetization easy axis of the soft magnetic layer and that of the magnetization easy axis of a magnetic layer which had received an exchange anisotropy from the antiferromagnetic layer respectively became vertical and parallel to the direction of the signal magnetic field to be detected.

In this method, when a magnetic layer was deposited, a magnetic field was applied by a permanent magnet to the direction within the film to which an anisotropy was desirably applied. When the outputs of these MR heads were measured by applying an AC signal magnetic field of about 200 e to these heads, the outputs of the MR heads of the present invention (i.e., the samples H2 and H4) were higher than that of a conventional MR head using the sample H1 by about 30% and about 70%, respectively.

EXAMPLE 9

An $\alpha$-$Fe_2O_3$ film was formed to be about 100 nm thick on a sapphire (11-20) substrate by an rf sputtering method. Thereafter, the sample was transferred to a ultrahigh vacuum evaporation apparatus and was analyzed by the RHEED. As a result, it was found that the $\alpha$-$Fe_2O_3$ film had been epitaxially grown in the same orientation as that of the substrate. Next, films made of Co, Cu, Ni—Fe, Cu and Ag were fabricated within the ultrahigh vacuum evaporation apparatus, and the MR properties thereof were evaluated by the same method as that of Example 1. The results are shown in the following Table 9.

TABLE 9

| No. | Structure of Sample | MR Ratio |
| --- | --- | --- |
| I1 | $Fe_2O_3$(100nm)/Co(3nm)/Cu(2nm)/$Ni_{0.8}Fe_{0.2}$(5nm) | 5.1% |
| I2 | $Fe_2O_3$(100nm)/Co(3nm)/Cu(2nm)/$Ni_{0.8}Fe_{0.2}$(5nm)/ Ag(3nm) | 7.2% |
| I3 | $Fe_2O_3$(100nm)/Co(3nm)/Cu(2nm)/$Ni_{0.8}Fe_{0.2}$(5nm)/ Cu(1nm) | 3.4% |
| I4 | $Fe_2O_3$(100nm)/Co(3nm)/Cu(2nm)/$Ni_{0.8}Fe_{0.2}$(5nm)/ Cu(1nm)/Ag(3nm) | 9.2% |
| I5 | $Fe_2O_3$(100nm)/Co(3nm)/Cu(2nm)/$Ni_{0.8}Fe_{0.2}$(5nm)/ Co(0.6nm)/Cu(1nm)/Ag(3nm) | 11.1% |
| I6 | $Fe_2O_3$(100nm)/Co(3nm)/Cu(2nm)/Co(0.6nm)/ $Ni_{0.8}Fe_{0.2}$(5nm)/Co(0.6nm)/Cu(1nm)/Ag(3nm) | 12.1% |
| I7 | $Fe_2O_3$(100nm)/Co(3nm)/Cu(2nm)/$Ni_{0.8}Fe_{0.2}$(5nm)/ Co(0.6nm)/Cu(1nm) | 3.3% |

As can be understood from Table 9, the MR ratios of the examples of the spin-valve device of the present invention using a metal reflective layer (i.e., the samples I2 and I4) are higher than those of the conventional examples of the spin-valve film (i.e., the samples I1 and I3). In addition, it is also clear from the results of the examples of the present invention (i.e., the samples I5 and I6) that the MR ratio is further increased by inserting an interface magnetic layer made of Co between a non-magnetic layer and a magnetic layer. On the other hand, in the conventional example (i.e., the sample I7), the MR ratio is hardly changed as compared with the sample I3. This is presumably because the spin-dependent scattering is hardly increased in the Co/Cu interface since the specular scattering of electrons is hardly generated on the surface of Cu.

In the examples of the present invention (i.e., the samples I5 and I6), the interface magnetic layer is assumed to be made of Co. However, the same effects can be attained even by the use of a Co-rich Co—Fe alloy.

EXAMPLE 10

An $\alpha$-$Fe_2O_3$ film was epitaxially grown to be about 50 nm thick on a sapphire (11-20) substrate by an rf sputtering method in the same way as in Example 9. Next, films made of Co, Cu, Ni—Fe, Cu, Ag and Ir—Mn were fabricated by the same rf sputtering method, and the MR properties thereof were evaluated by the same method as that of Example 1. The results are shown in the following Table 10.

TABLE 10

| No. | Structure of Sample | MR Ratio |
|---|---|---|
| J1 | $Fe_2O_3$(50nm)/Co(4nm)/Cu(2nm)/$Ni_{0.8}Fe_{0.2}$(6nm)/ Cu(2nm)/Co(5nm)/$Ir_{0.2}Mn_{0.8}$(8nm) | 5.8% |
| J2 | $Fe_2O_3$(50nm)/Co(4nm)/Cu(2nm)/$Ni_{0.8}Fe_{0.2}$(6nm)/ Cu(2nm)/Co(5nm)/$Ir_{0.2}Mn_{0.8}$(8nm)/Ag(3nm) | 8.2% |
| J3 | $Fe_2O_3$(50nm)/Co(4nm)/Cu(2nm)/$Ni_{0.8}Fe_{0.2}$(6nm)/ Cu(2nm)/Co(5nm)/$Ir_{0.2}Mn_{0.8}$(8nm)/Cu(1.5nm) | 4.9% |
| J4 | $Fe_2O_3$(50nm)/Co(4nm)/Cu(2nm)/$Ni_{0.8}Fe_{0.2}$(6nm)/ Cu(2nm)/Co(5nm)/$Ir_{0.2}Mn_{0.8}$(8nm)/Cu(1.5nm)/ Ag(3nm) | 10.3% |

As can be understood from Table 10, the MR ratios of the examples of the spin-valve device of the present invention using a metal reflective layer (i.e., the samples J2 and J4) are higher than those of the conventional examples of the spin-valve film (i.e., the samples J1 and J3).

As is apparent from the foregoing description, the spin-valve type magnetoresistive device of the present invention can obtain a larger MR ratio than that attained by a conventional spin-valve type magneto-resistive device. Thus, if the magnetoresistive device of the present invention is used for an MR head, a larger reproduction output can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A magnetoresistive device comprising:
   at least two magnetic layers stacked via a non-magnetic layer therebetween, thereby defining a structure having a first magnetic surface and a second magnetic surface on opposite sides of the structure; and
   a metal reflective layer of conduction electrons formed so as to include a first metal surface and a second metal surface,
   wherein the first metal surface is in contact with at least one of the first magnetic surface and the second magnetic surface, the metal reflective layer being likely to reflect conduction electrons while maintaining a spin direction of the electrons,
   wherein at least 10% of the second metal surface of the metal reflective layer has an unevenness in the range of 0 nm to about 0.3 nm, the second metal surface being likely to reflect conduction electrons while maintaining the spin direction of the electrons in order to generate an increased amount of specular scattering, and the metal reflective layer is mainly composed of at least on of Ag, Au, Bi, Sn and Pb.

2. A magnetoresistive device according to claim 1, further comprising a second non-magnetic layer between the metal reflective layer and the magnetic layer.

3. A magnetoresistive device according to claim 2, wherein the non-magnetic layers are mainly composed of Cu, and the metal reflective layer is mainly composed of at least one of Ag, Au, Bi, Sn and Pb.

4. A magnetoresistive device according to claim 2, wherein the magnetic layer in contact with the metal reflective layer via the non-magnetic layer is mainly composed of Co or a Co-rich Co—Fe alloy.

5. A magnetoresistive device according to claim 2, wherein the magnetic layer includes at least two layers of a magnetic layer and an interface magnetic layer which is mainly composed of Co or a Co-rich Co—Fe alloy, the interface magnetic layer being in contact with the metal reflective layer via the non-magnetic layer.

6. A magnetoresistive device according to claim 2, wherein the magnetic layer in contact with the metal reflective layer via the non-magnetic layer includes at least two interface magnetic layers which sandwich a soft magnetic layer therebetween and are mainly composed of Co or a Co-rich Co—Fe alloy.

7. A magnetoresistive device according to claim 1, wherein the non-magnetic layer is mainly composed of Cu.

8. A magnetoresistive device according to claim 1, wherein the magnetic layer directly in contact with the metal reflective layer is mainly composed of Co or a Co-rich Co—Fe alloy.

9. A magnetoresistive device according to claim 1, wherein the magnetic layer includes at least two layers of a magnetic layer and an interface magnetic layer which is mainly composed of Co or a Co-rich Co—Fe alloy, the interface magnetic layer being directly in contact with the metal reflective layer.

10. A magnetoresistive device according to claim 1, wherein the magnetic layer directly in contact with the metal reflective layer includes at least two interface magnetic layers which sandwich a soft magnetic layer therebetween and are mainly composed of Co or a Co-rich Co—Fe alloy.

11. A magnetoresistive device According to claim 1, wherein at least one of the at least two magnetic layers has a different coercivity from a coercivity of the other magnetic layer(s).

12. A magnetoresistive device according to claim 1, further comprising:
   an antiferromagnetic layer formed in contact with one of the first magnetic surface and the second magnetic surface, wherein the antiferromagnetic layer and the metal reflective layer are formed on opposite sides of the structure.

13. A magnetoresistive device according to claim 12, further comprising a further non-magnetic layer between the metal reflective layer and the magnetic surface.

14. A magnetoresistive device according to claim 12, wherein the antiferromagnetic layer is an oxide.

15. A magnetoresistive device according to claim 12, wherein the antiferromagnetic layer is made of Ni—O.

16. A magnetoresistive device according to claim 12, wherein the antiferromagnetic layer is made of $\alpha$-$Fe_2O_3$.

17. A magnetoresistive device according to claim 12, wherein the second magnetic layer includes two or more magnetic layers which are each stacked via a further non-magnetic layer.

18. A magnetoresistive device according to claim 12, wherein the antiferromagnetic layer is epitaxially grown over a substrate.

19. A magnetoresistive device according to claim 1, comprising a structure in which a first magnetic layer, the non-magnetic layer, a second magnetic layer, an antiferromagnetic layer and the metal reflective layer are stacked in this order.

20. A magnetoresistive device according to claim 19, further comprising a non-magnetic layer between the antiferromagnetic layer and the metal reflective layer.

21. A magnetoresistive device according to claim 20, wherein the antiferromagnetic layer is made of an Ir—Mn alloy.

22. A magnetoresistive device according to claim 19, wherein the antiferromagnetic layer is made of an Ir—Mn alloy.

23. A magnetoresistive device according to claim 1, comprising a structure in which a first antiferromagnetic layer, a magnetic layer, a non-magnetic layer, a soft magnetic layer, a non-magnetic layer, a magnetic layer, a second antiferromagnetic layer and a metal reflective layer are stacked in this order directly on a substrate or over the substrate via an underlying layer.

24. A magnetoresistive device according to claim 23, further comprising a non-magnetic layer between the second antiferromagnetic layer and the metal reflective layer.

25. A magnetoresistive device according to claim 24, wherein the second antiferromagnetic layer is made of an Ir—Mn alloy.

26. A magnetoresistive device according to claim 23, wherein the first antiferromagnetic layer is an oxide.

27. A magnetoresistive device according to claim 23, wherein the soft magnetic layer includes two or more magnetic layers which are stacked via a non-magnetic layer.

28. A magnetoresistive device according to claim 23, wherein the first antiferromagnetic layer is made of Ni—O.

29. A magnetoresistive device according to claim 28, wherein at least one of the first and the second antiferromagnetic layers is made of an Ir—Mn alloy.

30. A magnetoresistive device according to claim 23, wherein the first antiferromagnetic layer is made of $\alpha$-$Fe_2O_3$.

31. A magnetoresistive device according to claim 30, wherein the first antiferromagnetic layer is epitaxially grown over the substrate.

32. A magnetoresistive device according to claim 23, wherein the second antiferromagnetic layers are made of an Ir—Mn alloy.

33. A magnetoresistive device according to claim 1, comprising a structure in which a metal reflective layer, a first antiferromagnetic layer, a magnetic layer, a non-magnetic layer, a soft magnetic layer, a non-magnetic layer, a magnetic layer, a second antiferromagnetic layer and a metal reflective layer are stacked in this order directly on a substrate or over the substrate via an underlying layer.

34. A magnetoresistive device according to claim 33, further comprising a non-magnetic layer between the first antiferromagnetic layer and the metal reflective layer and/or between the second antiferromagnetic layer and the metal reflective layer.

35. A magnetoresistive device according claim 1, wherein the non-magnetic layer is epitaxially grown over a substrate.

36. A magnetoresistive device according to claim 35, wherein a (100) plane of the non-magnetic layer is epitaxially grown vertically to a growth direction of thin films.

37. A magnetoresistive device according to claim 36, wherein the non-magnetic layer is epitaxially grown over an MgO (100) substrate via a Pt underlying layer.

38. A magnetoresistive device comprising:

at least two magnetic layers stacked via a first non-magnetic layer therebetween, thereby defining a structure having a first magnetic surface and a second magnetic surface on opposite sides of the structure;

a metal reflective layer of conductive electrons formed so as to include a first metal surface and a second metal surface, wherein the first metal surface is in contact with at least one of the first magnetic surface and the second magnetic surface, the metal reflective layer being likely to reflect conduction electrons while maintaining a spin direction of the electrons, wherein at least 10% of the second metal surface of the metal reflective layer has an unevenness in the range of 0 nm to about 0.3 nm, the second metal surface being likely to reflect conduction electrons while maintaining the spin direction of the electrons, in order to generate an increased amount of specular scattering and the metal reflective layer is mainly composed of at least one of Ag, Au, Bi, Sn and Pb; and a second non-magnetic layer between the metal reflective layer and the magnetic layer, wherein the non-magnetic layers are mainly composed of Cu.

39. A magnetoresistive device according to claim 38, wherein at least one of the at least two magnetic layers have a different coercivity from a coercivity of the other magnetic layers(s).

40. A magnetoresistive device according to claim 38, comprising a structure in which an antiferromagnetic layer, a first magnetic layer, the non-magnetic layer, a second magnetic layer and the metal reflective layer are stacked in the order.

41. A magnetoresistive device according to claim 40, further comprising a non-magnetic layer between the second magnetic layer and the metal reflective layer.

* * * * *

UNITED STATES PATENT AND TRADEMARK OFFICE
CERTIFICATE OF CORRECTION

PATENT NO. : 6,535,362 B2
DATED : March 18, 2003
INVENTOR(S) : Kawawake et al.

It is certified that error appears in the above-identified patent and that said Letters Patent is hereby corrected as shown below:

Column 23,
Line 39, replace "at least on" with -- at least one --.

Column 24,
Line 30, replace "device According" with -- device according --.

Column 26,
Lines 41-42, replace "the order" with -- this order --.

Signed and Sealed this

Twenty-third Day of September, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,535,362 B2
DATED : March 18, 2003
INVENTOR(S) : Yasuhiro Kawawake, Hiroshi Sakakima and Mitsuo Satomi It is certified that error appears in the above-identified patent and that said Letters Patent is hereby corrected as shown below:

Title page,
Item [30], Foreign Application Priority Data, insert:
-- November 28, 1996   (JP).........8-317344
   December 24, 1996   (JP).........8-342967
   April 25, 1997        (JP).........9-108780 --

Signed and Sealed this

Twenty-second Day of March, 2005

JON W. DUDAS
*Director of the United States Patent and Trademark Office*